(12) United States Patent
Giles et al.

(10) Patent No.: US 7,309,662 B1
(45) Date of Patent: Dec. 18, 2007

(54) METHOD AND APPARATUS FOR FORMING A FILM ON A SUBSTRATE

(75) Inventors: Katherine Giles, Briston (GB); Knut Beekmann, North Somerset (GB); Christopher David Dobson, Bristol (GB); John MacNeil, Cardiff (GB); Antony Paul Wilby, Bristol (GB)

(73) Assignee: Aviza Europe Limited, Newport, Gwent (GB)

( * ) Notice: Subject to any disclaimer, the term of this patent is extended or adjusted under 35 U.S.C. 154(b) by 0 days.

(21) Appl. No.: 09/763,641

(22) PCT Filed: Jun. 26, 2000

(86) PCT No.: PCT/GB00/02301

§ 371 (c)(1),
(2), (4) Date: Mar. 29, 2001

(87) PCT Pub. No.: WO01/01472

PCT Pub. Date: Jan. 4, 2001

(30) Foreign Application Priority Data

| Jun. 26, 1999 | (GB) | ................................. 9914879.3 |
| Sep. 25, 1999 | (GB) | ................................. 9922691.2 |
| Sep. 25, 1999 | (GB) | ................................. 9922693.8 |
| Sep. 28, 1999 | (GB) | ................................. 9922801.7 |
| Jan. 14, 2000 | (GB) | ................................. 0000780.7 |

(51) Int. Cl.
*H01L 21/31* (2006.01)
*H01L 21/469* (2006.01)

(52) U.S. Cl. ...................... 438/780; 438/781; 438/788; 438/789

(58) Field of Classification Search ................ 438/787, 438/788, 789, 790, 780, 781
See application file for complete search history.

(56) References Cited

U.S. PATENT DOCUMENTS

| 3,223,040 A | 12/1965 | Dinkelkamp |
| 4,096,315 A | 6/1978 | Kubacki |
| 4,793,524 A | 12/1988 | Starr |

(Continued)

FOREIGN PATENT DOCUMENTS

DE   196 54 737 A1   7/1997

(Continued)

OTHER PUBLICATIONS

A. Grill et al., "Low Dielectric Constant Films Prepared by Plasma-Enhanced Chemical Vapor Deposition from Tetramethylsilane" Journal of Applied Physics, US, American Institute of Physics, New York, vol. 85, No. 6, Mar. 15, 1999, pp. 3314-3318.

(Continued)

*Primary Examiner*—Alexander Ghyka
(74) *Attorney, Agent, or Firm*—Volentine & Whitt, PLLC

(57) ABSTRACT

This invention relates to a method and apparatus for forming a film on the substrate. The method comprises supplying to the chamber in gaseous or vapor form a silicon containing organic compound and an oxidizing agent in the presence of a plasma to deposit a film on the substrate and setting the film such that carbon containing groups are retained therein. In particular embodiments the setting is achieved by exposing the film to $H_2$ plasma.

28 Claims, 19 Drawing Sheets

U.S. PATENT DOCUMENTS

| | | | |
|---|---|---|---|
| 4,822,632 A | 4/1989 | Williams et al. | |
| 4,894,254 A | 1/1990 | Nakayama et al. | |
| 5,095,938 A | 3/1992 | Garrison | |
| 5,098,741 A | 3/1992 | Nolet et al. | |
| 5,195,655 A | 3/1993 | Bukhman | |
| 5,270,267 A | 12/1993 | Ouellet | |
| 5,273,851 A | 12/1993 | Takei et al. | |
| 5,314,724 A | 5/1994 | Tsukune et al. | |
| 5,356,034 A | 10/1994 | Schlumberger | |
| 5,494,712 A | 2/1996 | Hu et al. | |
| 5,534,069 A | 7/1996 | Kuwabara et al. | |
| 5,593,741 A | 1/1997 | Ikeda | |
| 5,620,524 A | 4/1997 | Fan et al. | |
| 5,641,559 A | 6/1997 | Namiki | |
| 5,730,804 A | 3/1998 | Gomi et al. | |
| 5,786,039 A | 7/1998 | Brouquet | |
| 5,876,503 A | 3/1999 | Roeder et al. | |

FOREIGN PATENT DOCUMENTS

| | | |
|---|---|---|
| EP | 0 254 205 A2 | 7/1986 |
| EP | 0 529 334 A2 | 8/1991 |
| EP | 0 519 079 * | 12/1991 |
| EP | 0 519 079 A | 12/1992 |
| EP | 0519079 * | 12/1992 |
| EP | 0 726 599 A2 | 8/1996 |
| EP | 0 212 691 A1 | 3/1997 |
| EP | 0 761 841 A1 | 3/1997 |
| EP | 0 826 791 A | 3/1998 |
| EP | 0 826 791 A2 | 3/1998 |
| GB | 2108133 A | 5/1983 |
| GB | 2111064 A | 6/1983 |
| GB | 2220869 A | 1/1990 |
| GB | 2280169 A | 1/1995 |
| JP | 9-237785 | 9/1997 |
| JP | 9237785 | 9/1997 |
| JP | 10-310866 | 11/1998 |
| JP | 10310866 | 11/1998 |
| WO | WO 94/01885 | 1/1994 |
| WO | WO 96/29576 | 9/1996 |
| WO | WO 98/08249 A | 2/1998 |
| WO | WO 98/23787 | 6/1998 |
| WO | WO 99/41423 | 8/1999 |
| WO | WO 99/43866 | 9/1999 |
| WO | WO 00/51174 | 8/2000 |
| WO | WO 01/01472 A1 | 1/2001 |

OTHER PUBLICATIONS

Patent Abstracts of Japan, vol. 1999, No. 02, Feb. 26, 1999 & JP 10 310866 A, Nov. 24, 1998, abstract.

Akiro NARA et al., "Low Dielectric Constant Insulator Formed by Downstream Plasma CVD at Room Temperature Using TMS/O2", Jpn. J. Appl. Phys. vol. 36 (1997) Pt. 1, No. 3B, pp. 1477-1480.

* cited by examiner

210 / 200 TMS/O₂ 2000MT 250 W 0°C PLATEN PRE AND POST ANNEAL

| Date | Run No | CHMMS | H₂O₂ | O₂ | N₂ | RF Power (W) | Pressure (mT) | Platen (°C) | S/head (°C) | Dep rate (Å/min) | Uniformity | Rj | R.j Range | SiC/SiO | SiH/SiO | CH/SiO | K |
|---|---|---|---|---|---|---|---|---|---|---|---|---|---|---|---|---|---|
| 10/05/99 | 1 | 1000 | 0.75 | 0 | 0 | 50 | 1500 | 70 | 100 | 1166 | 6.6 | 1.482 | 0.0007 | | | | |
| | 2 | 1300 | 0.75 | 0 | 0 | 50 | 900 | 70 | 100 | 681 | 5.1 | 1.3702 | 0.0074 | | | | |
| | 3 | 1300 | 0.7 | 0 | 0 | 100 | 900 | 70 | 100 | 2542 | 6.5 | 1.3321 | 0.01 | | | | |
| | 4 | 1300 | 0.7 | 0 | 0 | 100 | 900 | 70 | 100 | 1853 | 6.1 | 1.3676 | 0.015 | | | | |
| | 6 | 1300 | 0.7 | 0 | 0 | 100 | 900 | 70 | 100 | 1450 | 8.5 | 1.3498 | 0.0125 | | | | |
| | | | | | | | | | | 3916 | 8.1 | 1.4736 | 0.0023 | | | | |
| | 7 | 1300 | 0.7 | 0 | 0 | 100 | 900 | 70 | 100 | 2008 | 8.3 | 1.3587 | 0.0075 | | | | |
| | | | | | | | | | | 3965 | 22.1 | 1.5007 | | | | | |
| | 8 | 1300 | 0.7 | 0 | 0 | 100 | 900 | 0 | 100 | 2097 | 22.5 | 1.3749 | 0.005 | | | | |
| | | | | | | | | | | 1392 | 13.5 | 1.4871 | 0.005 | | | | |
| | 9 | 1300 | 0.7 | 0 | 0 | 100 | 900 | 0 | 100 | 716 | 13.9 | 1.374 | 0.005 | | | | |
| | 10 | 1300 | 0.7 | 0 | 0 | 200 | 900 | 5 | 100 | | | | | | | | |
| | 11 | 1300 | 0.7 | 0 | 0 | 200 | 900 | 0 | 100 | 1176 | 27.3 | 1.4831 | 0.0106 | 0.0343 | 0 | 0.1062 | |
| | | | | | | | | | | 738 | 25.6 | 1.4064 | 0.025 | 0.0191 | 0 | 0.0069 | |
| | | | | | | | | | | 2000 | | | | | | | |
| Pot Refilled 24/05/99 | 12 | 800 | 0.5 | 0 | 0 | 100 | 900 | 70 | 100 | 1731 | 15.9 | 1.4618 | 0.0163 | 0.0183 | 0.0063 | 0.1102 | |
| | 13 | 800 | 0.4 | 0 | 0 | 500 | 900 | 70 | 100 | 9938 | 35 | 1.458 | | | | | |
| | 14 | 800 | 0.4 | 0 | 0 | 250 | 900 | 70 | 100 | 2166 | 16.2 | 1.4569 | 0.0156 | | | | |
| | 15 | 800 | 0 | 0 | 0 | 500 | 900 | 70 | 100 | -10000 | -30 | 1.45 | | | | | |
| | 16 | 800 | 0 | 0 | 0 | 250 | 900 | 70 | 100 | -6000 | -45 | | | | | | |
| | 17 | 800 | 0 | 0 | 0 | 250 | 900 | 70 | 100 | 5200 | | | | 0.0316 | 0.021 | 0.1715 | |
| | 18 | 800 | 0 | 0 | 0 | 250 | 900 | 70 | 100 | 7200 | | | | 0.0299 | 0.0365 | 0.2756 | |
| | 19 | 800 | 0 | 0 | 0 | 250 | 900 | 40 | 100 | 5338 | 23.4 | 1.4938 | 0.015 | 0.0322 | 0.0376 | 0.303 | 2.55 |
| | 20 | 800 | 0 | 0 | 0 | 250 | 900 | 40 | 100 | 4200 | | | | 0.03 | 0.039 | 0.2353 | 2.5-2.7 |
| 25/05/99 | 21 | 800 | 0 | 0 | 0 | 250 | 900 | 20 | 100 | 3641 | 14.4 | 1.4913 | | 0.0396 | 0.027 | 0.237 | 3.2 |
| | 22 | 800 | 0 | 0 | 0 | 250 | 900 | 20 | 100 | | | | | | | | 2.87 |
| | 23 | 800 | 0 | 0 | 0 | 250 | 900 | 20 | 100 | 6500 | | | | | | | |

*Fig. 6*

Flowfill chamber depositions using Cyclohexyldimethoxymethylsilane

P727 – Flowfill chamber (Flow_1), 40mm electrode gap – Syringe delivery system

Process Parameter / Bulk Film Properties

| Run Number | CHMMS (g/min) | O₂ Flow (Sccm) | N₂ Flow (Sccm) | Pressure (mT) | Power (W) | Showerhead (°C) | Platen (°C) | Dep rate (Å/min) | Uniformity (%) | Refractive Index | Dielectric Constant | FTIR P.A.R SiC/SiO | SiH/SiO | CH/SiO | Comment |
|---|---|---|---|---|---|---|---|---|---|---|---|---|---|---|---|
| 1 | 0.65 | 0 | 0 | 900 | 250 | 100 | 50 | 7224 | 10.6 | 1.4619 | | 0.0357 | 0.0111 | 0.1347 | Act. 1000mT, slight s/h |
| 2 | 0.65 | 0 | 0 | 900 | 250 | 100 | 50 | | | | | 0.0345 | 0.0296 | 0.03672 | Peeled off in FTS |
| 3 | 0.65 | 0 | 100(1+8) | 900 | 250 | 100 | 50 | 8190 | 6.5 | 1.4875 | | 0.039 | 0.015 | 0.1545 | Plasma dark red |
| 4 | 0.65 | 0 | 50(1+8) | 900 | 250 | 100 | 50 | 5810 | 22.8 | 1.4652 | | 0.0354 | 0.0269 | 0.3499 | Purple Plasma |
| 5 | 0.65 | 0 | 50(1+8) | 900 | 250 | 100 | 50 | 8289 | 13.1 | 1.51 | | 0.0384 | 0.0107 | 0.131 | |
| 6 | 0.65 | 0 | 50(1+8) | 900 | 250 | 100 | 50 | 8906 | 4.47 | 1.5089 | | 0.0379 | 0.0139 | 0.1238 | |
| 7 | 0.65 | 0 | 100(1+8) | 900 | 250 | 100 | 50 | 8717 | 2.37 | 1.4475 | | 0.0364 | 0.0172 | 0.1886 | |
| 8 | 0.65 | 0 | 100(1+8) | 900 | 100 | 100 | 50 | 2789 | 9.2 | 1.4775 | | 0.0349 | 0.0367 | 0.3518 | RI wafer |
| 9 | 0.65 | 0 | 100(1+8) | 900 | 500 | 100 | 50 | 12748 | 3.4 | 1.489 | | | | | |
| 10 | 0.85 | 0 | 100(1+8) | 900 | 500 | 100 | 50 | 14222 | 1.77 | 1.538 | | | | | |
| 11 | 0.85 | 0 | 200(1) | 900 | 500 | 100 | 50 | 14192 | 1.5 | 1.5228 | | | | | |
| 12 | 0.85 | 0 | 200(8) | 900 | 500 | 100 | 50 | 14282 | 1 | 1.5444 | | | | | |
| 13 | 0.85 | 0 | 100(1+8) | 500 | 500 | 100 | 50 | 8790 | 3.7 | 1.4895 | | | | | |
| 14 | 0.85 | 0 | 100(1+8) | 500 | 500 | 100 | 50 | 11382 | 6.2 | 1.4468 | | | | | RI wafer |
| 15 | 0.85 | 0 | 200(8) | 900 | 500 | 100 | 50 | 19116 | 5.6 | 1.4634 | | | | | RI wafer |
| 16 | 0.65 | 0 | 100(1+8) | 900 | 250 | 100 | 50 | 10242 | 6.6 | 1.4558 | | | | | RI wafer |
| 17 | 0.65 | 0 | 200(8) | 900 | 250 | 100 | 50 | | | | 3* | | | | K=2.4 post oven anneal |
| 18 | 0.85 | 0 | 200(8) | 800 | 500 | 100 | 50 | | | | 2.78* | | | | *Left overnight before measurement |
| 19 | 0.65 | 0 | 100(1+8) | 500 | 500 | 100 | 50 | | | | 2.82* | | | | K=2.55 post oven anneal |
| 20 | 0.65 | 0 | 100(1+8) | 900 | 500 | 100 | 50 | | | | 3.01* | | | | |
| 21 | 0.85 | 0 | 100(1+8) | 900 | 500 | 100 | 50 | 7869 | 7.8 | 1.5144 | | | | | Grainy film, 5min FTS |
| 22 | 0.85 | 0 | 100(1+8) | 900 | 500 | 100 | 50 | 15697 | 5.7 | 1.5387 | | | | | 5min FTS |
| 23 | 0.85 | 0 | 100(1+8) | 900 | 500 | 100 | 50 | 14751 | 3.5 | 1.4737 | | | | | 5min FTS |
| 24 | 0.85 | 0 | 100(1+8) | 900 | 500 | 100 | 50 | 14345 | 0.9 | 1.4737 | | | | | 10min FTS |
| 25 | 0.85 | 0 | 100(1+8) | 900 | 500 | 100 | 50 | 14079 | 1.6 | 1.4582 | | | | | 30min FTS |
| 26 | 0.85 | 0 | 200(8) | 900 | 500 | 100 | 50 | 18864 | 4.5 | 1.4332 | | | | | 5min FTS |
| 27 | 0.85 | 0 | 200(8) | 900 | 750 | 100 | 50 | 17841 | 7.2 | 1.4327 | | | | | 5min FTS |
| 28 | 0.85 | 0 | 200(8) | 900 | 250 | 100 | 50 | 11511 | 6.3 | 1.4263 | | | | | 5min FTS |
| 29 | 0.85 | 0 | 200(8) | 900 | 500 | 100 | 50 | 15565 | 3.5 | 1.4856 | | 0.0317 | 0.0193 | 0.1366 | 5min FTS |
| 30 | 0.85 | 0 | 200(8) | 900 | 500 | 100 | 50 | 14807 | 3.1 | 1.4575 | | 0.0336 | 0.0096 | 0.0785 | 30min FTS |
| 31 | 0.85 | 0 | 200(8) | 1200 | 750 | 100 | 50 | 16898 | 3.8 | 1.503 | | 0.0284 | 0.016 | 0.1418 | 5min FTS |
| 32 | 0.85 | 0 | 200(8) | 600 | 250 | 100 | 50 | 11658 | 11.5 | 1.499 | | 0.0342 | 0.0338 | 0.3437 | 5min FTS |
| 33 | 0.85 | 0 | 200(8) | 900 | 500 | 100 | 50 | | | | 2.56 | | | | Depped with 30min FTS + Cap |
| 34 | 0.85 | 0 | 200(8) | 900 | 500 | 100 | 50 | | | | 2.66 | | | | Depped with 30min FTS |
| 35 | 0.85 | 0 | 200(8) | 900 | 500 | 100 | 50 | 17106 | 3.7 | 1.4552 | | 0.0309 | 0.0199 | 0.1562 | 5min FTS |
| 36 | 0.85 | 0 | 200(8) | 900 | 500 | 100 | 50 | 17194 | 3.7 | 1.458 | | 0.031 | 0.0202 | 0.1498 | 5min FTS |
| 37 | 0.85 | 0 | 200(8) | 900 | 500 | 100 | 50 | 24708 | 2.2 | 1.5316 | | 0.0311 | 0.0196 | 0.1338 | 5min FTS |
| 38 | 0.85 | 0 | 200(8) | 900 | 500 | 100 | 50 | 9953 | 1 | 1.5109 | | 0.0353 | 0.018 | 0.1283 | 5min FTS |
| 39 | 0.85 | 0 | 200(8) | 900 | 250 | 100 | 50 | 7128 | 0.87 | 1.5296 | | 0.035 | 0.0248 | 0.258 | 5min FTS |
| 40 | 0.85 | 50 | 150(8) | 900 | 500 | 100 | 50 | 9652 | 3.8 | 1.4575 | | 0.0285 | 0.0162 | 0.2006 | 5min FTS |
| 41 | 0.85 | 50 | 150(8) | 900 | 500 | 100 | 50 | 18448 | 3.8 | 1.4209 | | 0.0203 | 0.009 | 0.0839 | Faint powder showerhead pattern |

*Fig 7 (Part 1 of 3)*

| Run Number | CHMMS (g/min) | O₂ Flow (Sccm) | N₂ Flow (Sccm) | Pressure (mT) | Power (W) | Showerhead (°C) | Platen (°C) | Dep rate (Å/min) | Uniformity (%) | Refractive Index | Dielectric Constant | SiC/SiO | FTIR P.A.R SiH/SiO | CH/SiO | Comment |
|---|---|---|---|---|---|---|---|---|---|---|---|---|---|---|---|
| 42 | 0.85 | 50 | 250(8) | 900 | 500 | 100 | 50 | ~1.8μm | - | - | | 0.0209 | 0.0058 | 0.0572 | Entire film cloudy |
| 43 | 0.85 | 200 | 0 | 900 | 500 | 100 | 50 | 17888 | 5.2 | 1.3978 | | 0.0161 | 0.003 | 0.0356 | Powder stripes |
| 44 | 0.85 | 50 | 150(8) | 900 | 1000 | 100 | 50 | 178896 | 6.4 | 1.5031 | | 0.0145 | 0.0068 | 0.0588 | Hazy powder |
| 45 | 0.85 | 0 | 200(8) | 600 | 250 | 100 | 50 | 8213 | 3.4 | 1.4669 | | 0.0378 | 0.0164 | 0.2189 | RI Wafer |
| 46 | 0.85 | 0 | 0 | 600 | 100 | 100 | 50 | 9912 | 8.2 | 1.4649 | | | | | RI Wafer |
| 47 | 0.85 | 0 | 200(8) | 1200 | 100 | 100 | 50 | 1792 | 29.2 | 1.4635 | | | | | RI Wafer |
| 48 | 0.85 | 0 | 200(8) | 600 | 250 | 100 | 50 | 10233 | 3.3 | fix | | 0.0387 | 0.0516 | 0.3823 | No FTS |
| 49 | 0.85 | 0 | 200(8) | 600 | 250 | 100 | 50 | | | | 2.56 | | | | 5min FTS, no cap |
| 50 | 0.85 | 0 | 200(8) | 900 | 250 | 100 | 50 | | | | 2.72 | | | | Wafer thin, 1st of day, 5min FTS, Cap |
| 51 | 0.85 | 0 | 200(8) | 900 | 250 | 100 | 50 | | | | 3.16 | | | | No FTS |
| 52 | 0.85 | 0 | 200(8) | 900 | 250 | 100 | 50 | | | | 2.33 | | | | 30min FTS, Cap |
| 53 | 0.85 | 0 | 200(8) | 900 | 250 | 100 | 50 | 13034 | 5.7 | fix | | 0.0371 | 0.0532 | 0.3933 | No FTS |
| 54 | 0.85 | 0 | 200(8) | 900 | 250 | 100 | 50 | 13929 | 5.7 | fix | | 0.0367 | 0.0599 | 0.3885 | No FTS |
| 55 | 0.85 | 0 | 150(8) | 900 | 250 | 100 | 50 | 11131 | 7.7 | fix | | 0.0368 | 0.0135 | 0.151 | 5min FTS |
| 56 | 0.85 | 0 | 200(8) | 900 | 250 | 100 | 50 | 9809 | 4.9 | fix | | 0.0376 | 0.0101 | 0.0785 | 30min FTS |
| 57 | 0.85 | 0 | 200(8) | 900 | 250 | 100 | 50 | 9853 | 3.4 | fix | | 0.0363 | 0.0082 | 0.0583 | 60min FTS |
| 58 | 0.85 | 0 | 200(8) | 900 | 250 | 100 | 50 | | | | 2.62 | | | | 5min FTS, no cap |
| 59 | 0.85 | 0 | 200(8) | 900 | 250 | 100 | 50 | | | | 2.55 | | | | 30min FTS, no cap |
| 60 | 0.85 | 0 | 200(8) | 900 | 250 | 100 | 50 | | | | 2.52 | | | | 60min FTS, no cap |
| 61 | 0.85 | 0 | 200(8) | 900 | 250 | 100 | 50 | 13020 | 8.1 | 1.5351 | | 0.0374 | 0.0551 | 0.3939 | No FTS |
| 62 | 0.85 | 0 | 200(8) | 900 | 250 | 100 | 50 | 12601 | 7.2 | 1.5658 | | 0.0367 | 0.0573 | 0.3911 | No FTS |
| 63 | 0.85 | 0 | 200(8) | 900 | 250 | 100 | 50 | 12450 | 6.5 | 1.4763 | | 0.0322 | 0.02 | 0.2575 | 5min FTS @500°C |
| 64 | 0.85 | 0 | 200(8) | 900 | 250 | 100 | 50 | 11885 | 4.2 | 1.4466 | | 0.0344 | 0.0126 | 0.1847 | 30min FTS @500°C |
| 65 | 0.85 | 0 | 200(8) | 900 | 250 | 100 | 50 | 10679 | 137 | 1.5553 | | 0.0373 | 0.0102 | 0.109 | 60min FTS @500°C |
| 66 | 0.85 | 0 | 200(8) | 900 | 250 | 100 | 50 | | | | 2.93 | | | | 5min FTS @500°C no cap |
| 67 | 0.85 | 0 | 200(8) | 900 | 250 | 100 | 50 | | | | 2.97 | | | | 5min FTS, cap @500°C |
| 68 | 0.85 | 0 | 200(8) | 900 | 250 | 100 | 50 | | | | 2.61 | | | | 60min FTS, cap @500°C |
| 69 | 0.85 | 0 | 200(8) | 900 | 500 | 100 | 50 | 17388 | 4.2 | 1.4207 | | 0.033 | 0.0111 | 0.094 | 30min FTS |
| 70 | 0.85 | 0 | 200(8) | 900 | 500 | 100 | 50 | 17484 | 3.8 | 1.4146 | | 0.0323 | 0.0103 | 0.0825 | 60min FTS |
| 71 | 0.85 | 0 | 200(8) | 900 | 500 | 100 | 50 | | | | 2.55 | | | | 30min FTS, cap |
| 72 | 0.85 | 0 | 200(8) | 900 | 500 | 100 | 50 | | | | 2.53 | | | | 60min FTS, cap |
| 73 | 0.85 | 50 | 200(8) | 900 | 250 | 100 | 50 | 9869 | 4.3 | 1.4218 | | 0.0306 | 0.0073 | 0.0635 | 5min FTS(centre cracks) |
| 74 | 0.85 | 50 | 150(8) | 900 | 250 | 100 | 50 | 9554 | 4.2 | 1.3767 | | 0.0299 | 0.0064 | 0.0403 | 30min FTS no cracks |
| 75 | 0.85 | 50 | 150(8) | 900 | 250 | 100 | 50 | | | | 2.26 | | | | 30min FTS, cap |
| 76 | 0.85 | 0 | 200(8) | 900 | 250 | 100 | 50 | 13971 | 8 | 1.4022 | | | | | RI Wafer |
| 77 | 0.85 | 0 | 150(8) | 900 | 250 | 100 | 50 | 12355 | 8.3 | 1.4308 | | | | | RI Wafer |
| 78 | 0.85 | 50 | 150(8) | 900 | 250 | 100 | 50 | 11928 | 6.1 | 1.4115 | | | | | RI Wafer |
| 79 | 0.85 | 50 | 150(8) | 900 | 250 | 100 | 50 | 11070 | 6.9 | 1.3942 | | | | | RI Wafer |
| 80 | 0.85 | 0 | 200(8) | 900 | 500 | 100 | 50 | 25340 | 7.4 | 1.4493 | | | | | RI Wafer |
| 81 | 0.85 | 0 | 200(8) | 900 | 500 | 100 | 50 | 22157 | 6.5 | 1.4307 | | | | | RI Wafer |
| 82 | 0.85 | 0 | 200(8) | 900 | 500 | 100 | 50 | 17612 | 3.4 | 1.4354 | | | | | 5min FTS |
| 83 | 0.85 | 0 | 200(8) | 900 | 500 | 100 | 50 | 17736 | 2.7 | 1.5128 | Stress = 8.839E8T | | | | No FTS |
| 84 | 0.85 | 0 | 200(8) | 800 | 500 | 100 | 50 | 14636 | 2.4 | 1.4463 | Stress = -6.869E8C | | | | 30min FTS |
| 85 | 0.85 | 0 | 200(8) | 900 | 500 | 100 | 20 | 21774 | 6.8 | 1.5393 | Stress = 1.027E9T | | | | No FTS |
| 86 | 0.85 | 0 | 200(8) | 900 | 500 | 100 | 20 | | | | | 0.0343 | 0.3071 | 0.3071 | No FTS |
| 87 | 0.85 | 0 | 200(8) | 900 | 500 | 100 | 20 | | | | | 0.036 | 0.079 | 0.079 | 30min FTS (peeled off) |
| 88 | 0.85 | 0 | 200(8) | 900 | 500 | 100 | 20 | | | | 2.43 | 0.0349 | 0.0749 | 0.0749 | 60min FTS (peeled off) |

Fig 7 (Part 2 of 3)

| Run Number | CHMMS (g/min) | O₂ Flow (Sccm) | N₂ Flow (Sccm) | Pressure (mT) | Power (W) | Showerhead (°C) | Platen (°C) | Dep rate (Å/min) | Uniformity (%) | Refractive Index | Dielectric Constant | SIC/SIO | FTIR P.A.R SIH/SIO | CH/SIO | Comment |
|---|---|---|---|---|---|---|---|---|---|---|---|---|---|---|---|
| 89 | 0.85 | 0 | 200(8) | 900 | 500 | 100 | 50 | 17344 | 2.4 | 1.4129 | | 0.0341 | 0.0103 | 0.1051 | |
| 90 | 0.85 | 25 | 175(8) | 900 | 500 | 100 | 50 | 17840 | 1.9 | 1.4398 | | 0.027 | 0.0075 | 0.0776 | Feint powder s/h |
| 91 | 0.85 | 25 | 175(8) | 900 | 250 | 100 | 50 | 9279 | 2.4 | 1.3875 | | 0.0327 | 0.0079 | 0.0725 | |
| 92 | 0.85 | 50 | 150(8) | 900 | 250 | 100 | 50 | 9663 | 5.9 | 1.3646 | | 0.0308 | 0.0065 | 0.0456 | Small amount of centre cracking |
| 93 | 0.85 | 50 | 0 | 900 | 500 | 100 | 50 | ~10000 | | | | 0.0344 | 0.0079 | 0.0532 | Massive centre cracking |
| 94 | 0.85 | 50 | 0 | 900 | 500 | 100 | 50 | 21408 | 4.6 | 1.4199 | | 0.0273 | 0.0076 | 0.0725 | |
| 95 | 0.85 | 50 | 150(8) | 900 | 250 | 100 | 50 | | | | 2.49 | | | | 30min FTS, cap |
| 96 | 0.85 | 50 | 150(8) | 900 | 250 | 100 | 50 | | | | 2.48 | | | | 30min FTS, cap |
| 97 | 0.85 | 25 | 175(8) | 900 | 250 | 100 | 50 | 9917 | 8.8 | 1.4521 | | 0.0342 | 0.0093 | 0.1091 | 5min FTS |
| 98 | 0.85 | 25 | 175(8) | 900 | 250 | 100 | 50 | 9848 | 11.7 | 1.4592 | | 0.0334 | 0.0117 | 0.1441 | 5min FTS |
| 99 | 0.85 | 25 | 175(8) | 900 | 250 | 100 | 50 | | | | 2.437 | | | | 5min FTS, cap |
| 100 | 0.85 | 25 | 175(8) | 900 | 250 | 100 | 50 | | | | 2.286 | | | | 60min FTS, cap |
| 101 | 0.85 | 25 | 175(8) | 900 | 250 | 100 | 50 | | | | 2.426 | | | | 30min FTS, cap |
| 102 | 0.43 | 0 | 100(8) | 900 | 500 | 100 | 50 | 12080 | 7.6 | 1.5107 | | 0.0239 | 0.0093 | 0.086 | 5min FTS Showerhead dots |
| 103 | 0.43 | 0 | 100(8) | 800 | 500 | 100 | 50 | 12502 | 5.1 | 1.5081 | | 0.025 | 0.0119 | 0.0116 | 5min FTS Showerhead dots |
| 104 | 0.64 | 0 | 150(8) | 900 | 500 | 100 | 50 | 20470 | | 1.4983 | 2.9 | | | | 30min FTS cap |
| 105 | 0.85 | 0 | 400(8) | 900 | 500 | 100 | 50 | 14074 | 3.5 | 1.496 | | 0.0282 | 0.0149 | 0.0912 | 5min FTS |
| 106 | 0.85 | 0 | 400(8) | 900 | 750 | 100 | 50 | 13930 | 2.4 | | | 0.0278 | 0.0143 | 0.0771 | 30min FTS |
| 107 | 0.85 | 0 | 400(8) | 900 | 750 | 100 | 50 | | | | 2.72 | | | | 30min FTS CAP |
| | | | | | | | | CHAMBER SPACING CHANGED TO 20MM | | | | | | | |
| 108 | 0.85 | 0 | 200(8) | 900 | 500 | 100 | 50 | 17826 | | 1.3437 | | | | | 30min FTS |
| 109 | 0.85 | 0 | 200(8) | 900 | 500 | 100 | 50 | 21765 | 8.4 | 1.3654 | | | | | 30min FTS, RI Wafer |
| 110 | 0.85 | 25 | 175(8) | 800 | 250 | 100 | 50 | 11438 | 17.6 | 1.3713 | | | | | 30min FTS |
| 111 | 0.85 | 25 | 175(8) | 600 | 250 | 100 | 50 | 12828 | 13.6 | 1.3888 | | | | | 30min FTS, RI Wafer |
| 112 | 0.85 | 0 | 200(8) | 600 | 500 | 100 | 50 | 14280 | 11.1 | 1.447 | | | | | 30min FTS, RI Wafer |
| 113 | 0.85 | 0 | 200(8) | 900 | 500 | 100 | 50 | 12185 | 3.4 | 1.3756 | | | | | 30min FTS |
| 114 | 0.85 | 0 | 200(8) | 400 | 250 | 100 | 50 | 9049 | 2.8 | 1.4745 | | | | | 30min FTS |
| 115 | 0.85 | 0 | 200(8) | 400 | 500 | 100 | 50 | 10620 | 8.6 | 1.4549 | | | | | 30min FTS, RI Wafer |
| 116 | 0.85 | 0 | 200(8) | 400 | 500 | 100 | 50 | 9073 | 3.5 | 1.4524 | | 0.0255 | 0.0143 | 0.0724 | 30min FTS |
| 117 | 0.85 | 0 | 200(8) | 900 | 500 | 100 | 50 | 14852 | 2.3 | 1.4384 | | 0.0343 | 0.0096 | 0.0865 | 30min FTS |
| 118 | 0.85 | 0 | 200(8) | 400 | 500 | 100 | 50 | | | | 2.556 | | | | 30min FTS, Cap |
| 119 | 0.85 | 0 | 200(8) | 900 | 500 | 100 | 50 | | | | 2.76 | | | | 30min FTS, Cap |
| 120 | 0.85 | 0 | 200(8) | 900 | 500 | 100 | 50 | 11633 | | 1.4334 | | 0.0363 | 0.0094 | 0.0751 | 30min FTS, Stress=8.78E8T |
| 121 | 0.85 | 0 | 200(8) | 900 | 250 | 100 | 50 | 8813 | | 1.399 | | 0.0386 | 0.0091 | 0.01019 | 30min FTS, Stress=7.313E8T |
| 122 | 0.85 | 25 | 175(8) | 900 | 250 | 100 | 50 | 9207 | | 1.3954 | | 0.0329 | 0.0069 | 0.0493 | 30min FTS, Stress=9.856E8T |
| 123 | 0.85 | 50 | 150(8) | 900 | 250 | 100 | 50 | 10515 | | 1.381 | | 0.0313 | 0.007 | 0.0502 | 30min FTS, Stress=9.325E8T |
| 124 | 0.85 | 15 | 185(8) | 900 | 250 | 100 | 50 | 10640 | | 1.3807 | | 0.034 | 0.0051 | 0.0556 | 30min FTS, Stress=9.041E8T |
| 125 | 0.85 | 75 | 125(8) | 900 | 250 | 100 | 50 | 11727 | | 1.3597 | | 0.0295 | 0.0042 | 0.0344 | 30min FTS, Stress=8.544E8T |
| 126 | 0.85 | 100 | 100(8) | 900 | 250 | 100 | 50 | 12598 | | 1.3481 | | 0.0293 | 0.0056 | 0.0336 | 30min FTS, Stress=8.778E8T |
| 127 | 0.85 | 25 | 175(8) | 900 | 250 | 100 | 50 | 9206 | | 1.3718 | | 0.0331 | 0.0061 | 0.0466 | 30min FTS, Stress=8.025E8T |
| 128 | 0.85 | 15 | 185(8) | 900 | 250 | 100 | 50 | | | | 2.414 | | | | 30min FTS |
| 129 | 0.85 | 75 | 125(8) | 900 | 250 | 100 | 50 | | | | 2.4 | | | | 30min FTS |
| 130 | 0.85 | 100 | 100(8) | 900 | 250 | 100 | 50 | | | | 2.49 | | | | 30min FTS |
| 131 | 0.85 | 25 | 175(8) | 900 | 250 | 100 | 50 | | | | 2.41 | | | | 30min FTS |
| 132 | 0.85 | 35 | 165(8) | 900 | 250 | 100 | 50 | | | | 2.48 | | | | 30min FTS |
| 133 | 0.85 | 15 | 185(8) | 900 | 250 | 100 | 50 | | | | 2.43 | | | | 30min FTS |
| 134 | 0.85 | 30 | 170(8) | 900 | 250 | 100 | 50 | | | | 2.45 | | | | 30min FTS |

*Fig. 7 (Part 3 of 3)*

1.) 800CHMMS, 0.4g/min H2O2, 900mT, 250W as deposited

2.) 800Sccm CHMMS, 0.4g/min H2O2, 900mT, 500W

CHMMS, 2
CHMMS + H2O2 + PLASMA

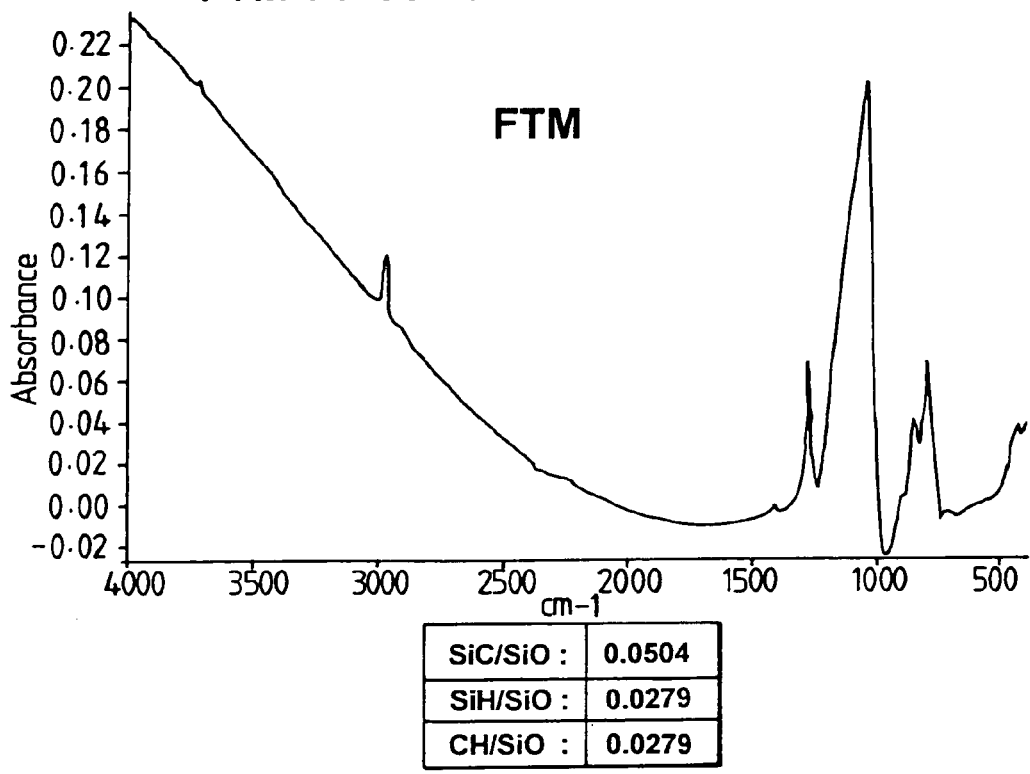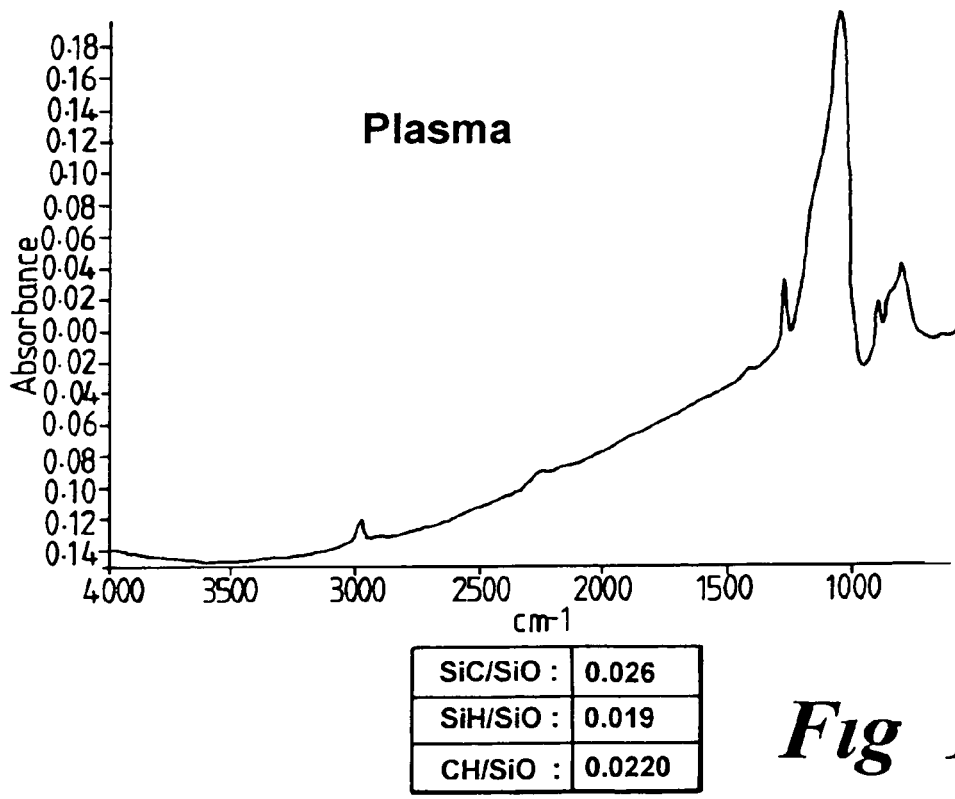
Fig 11

METHOD AND APPARATUS FOR FORMING A FILM ON A SUBSTRATE

This invention relates to a method and apparatus for forming a film on a substrate particularly, although not exclusively, to a film which is deposited on a semiconductor silicon wafer with flowing properties and retains carbon-containing groups on setting.

A number of methods have been disclosed for depositing a thin film on a semiconductor wafer, and examples included U.S. Pat. No. 5,314,724, U.S. Pat. No. 489,753, U.S. Pat. No. 5,593,741, EP-A-0731982 and EP-A-0726599. It can be seen from these that, up until recently, organic-containing silicon precursors have been processed or further processed in such a way as to avoid or subsequently remove organic components from the as-deposited film; this is, for example, disclosed in U.S. Pat. No. 5,314,724. In addition, for some applications, it has been found to be difficult to retain both good film quality and good gap-fill capability on the surfaces and in recesses of a wafer on which the film is deposited.

According to a first aspect of the present invention, there is provided a method of forming a film on a substrate comprising:

(a) positioning the substrate on a support in a chamber;
(b) Supplying to the chamber in gaseous or vapour form a silicon-containing organic compound and an oxidising agent in the presence of a plasma to deposit a film on the substrate; and
(c) setting the film such that carbon-containing groups are retained therein.

The present invention provides a method of forming an unset film. Typically, the film is flowable (that is a film with a degree of surface mobility) and may thus provide good gap fill properties on the substrate.

It should be understood that without affecting the generality of this invention where gap fill properties are not required, e.g. for InterMetal Dielectric (IMD) layers on a semiconductor, then a flowing intermediate film will not be required. However the intermediate film deposited according to this invention will contain OH, which is almost entirely removed by the 'setting' process.

The formation of an OH and CH containing intermediate which is then further processed to remove OH but contain CH enables the formation of improved dielectric layers.

The substrate may be a semiconductor wafer, for example a silicon semiconductor wafer of the type known in the art.

Preferably, the oxidising agent is oxygen, although others could be used, for example $H_2O_2$.

For example, the silicon-containing organic compound may be an organosilane or an organosiloxane. Preferably, the silicon-containing organic compound is an alkylsilane, and even more preferably is a tetraalkysilane. In a particularly preferred embodiment of the invention, the silicon-containing organic compound is tetramethylsilane (TMS). However, for example, other organosilanes or organosiloxanes could be used, one example being 1,1,3,3-tetramethyldisiloxane (TMDS).

Experiments suggest that methoxysilanes, and in particular methoxymethylsilanes, produce films with very low dielectric constants and may be particularly preferred.

Particularly good results have been achieved with cyclohexyldimethoxymethylsilane (CHDMMS) which has the following structure:

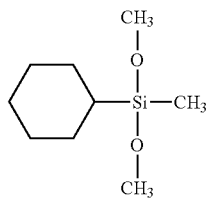

Experiments have also shown that a methoxysilane (e.g. CHDMMS) may be able to be processed as in the above method described, but without any oxidising agent present in the plasma. It is supposed that this is because the Si—O bond already exists as part of the methoxy group.

Accordingly, according to another aspect the invention consists in a method of forming a film on a substrate comprising:

(a) positioning the substrate on a support in a chamber;
(b) supplying to the chamber in gaseous or vapour form an organic compound including an Si—O bond to deposit a film on the substrate; and
(c) setting (e.g. annealing) the film such that carbon-containing groups are retained therein.

Preferably the compound is supplied in the presence of a plasma, but other energy sources may be utilised to cause appropriate deposition and these may be combined with spin-on techniques.

The film may be deposited on a substrate positioned on a low-temperature support for example, a support at a temperature of about 0° C. Indeed temperatures in the range 0° C. to 70° C. have produced practical results, with temperatures of 30° and 50° C. proving particularly practical.

In one embodiment, the method may further comprise supplying RF power during deposition of the film. This RF power is preferably applied to a showerhead or the like through which the gaseous precursors are passed into the chamber.

Whilst any suitable experimental conditions may be used, it has been found that typical conditions include a flow rate of 210 sccm tetramethylsilane, a flow rate of 200 sccm $O_2$, a chamber pressure of 2000 mT, a support temperature of 0° and a showerhead temperature of 100° C., and 250 watts of 380 khz RF power applied to the showerhead, although it is pointed out that these are only typical conditions.

The setting of the film may be carried out by an annealing step, for example at a temperature of about 450° C. which serves to remove water from the deposited film. It has been found that typical k value of the set film is about 2.55, for example for a 6000 Å thick film deposited with a base layer (prior to deposition of the film) or capping layer (on the formed layer) after an annealing step at about 450° C. in the absence of oxygen. This k value is a measure of the dielectric constant and it can be seen that the present invention provides a particularly low dielectric constant.

Alternatively, and often preferably, the setting step is performed by exposing the deposited film to an $H_2$ containing plasma without any prior heating of the film. In this connection it is preferred that the support is not biased during the deposition stage to avoid heating arising from ion bombardment.

According to a third aspect of the present invention, there is provided a method of forming a film on a substrate comprising:

(a) positioning the substrate on a support in a chamber;
(b) supplying to the chamber in gaseous or vapour form tetramethylsilane and oxygen in the presence of a plasma and a supply of RF power to deposit a film on the substrate; and (c) setting the film such that carbon-containing groups are retained therein.

The setting step can be performed as set out above.

Particularly good results have been achieved with the $H_2$ plasma treatment without prior heating.

According to a further aspect of the present invention, there is provided an apparatus for forming a film on a substrate, the apparatus comprising:

(a) a support for the substrate positioned in a chamber;
(b) means for supplying to the chamber in gaseous or vapour form a silicon-containing organic compound and an oxidising agent in the presence of a plasma to deposit a film on the substrate; and
(c) means for setting the film such that carbon-containing groups are retained therein.

The apparatus may, in one embodiment, further comprise means for improving the uniformity of the deposition of the film on the substrate. This may be arranged in the region of, or around, a showerhead and, whilst the applicant is not to be restricted hereby, it is thought that its role in the uniformity of deposition is possibly as a result of providing a site for surface reactions about the surface periphery thus enhancing deposition rate at the edge of the substrate.

Although the invention has been defined above, it is to be understood that it includes any inventive combination of the features set out above or in the following description.

The invention may be performed in various ways and a specific embodiment will now be described, by way of example, with reference to the accompanying drawings, in which.

Figure 3A:
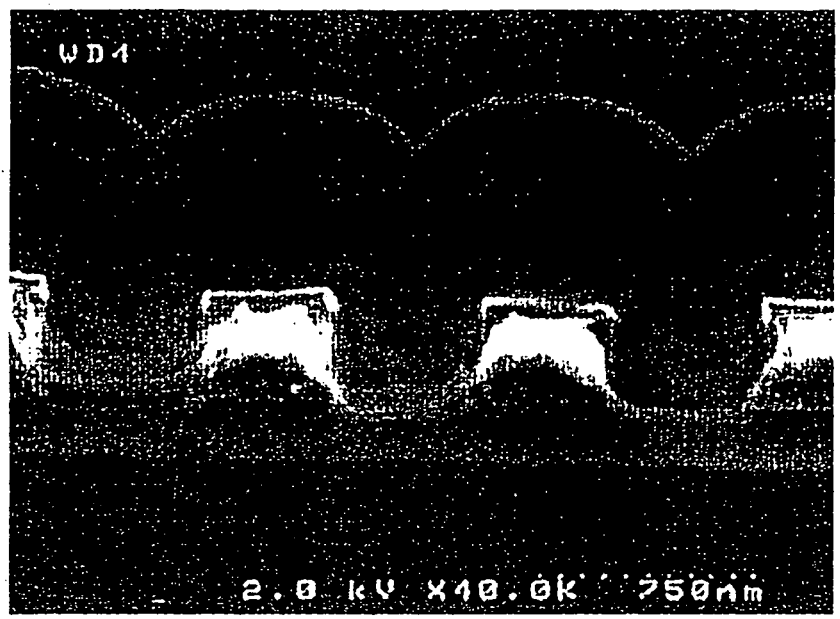
Figure 3B:
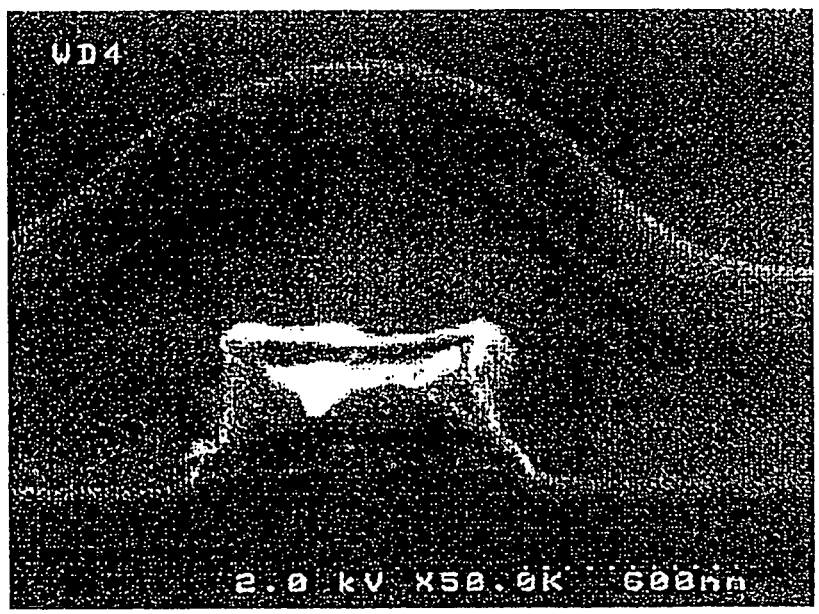
Figure 4:
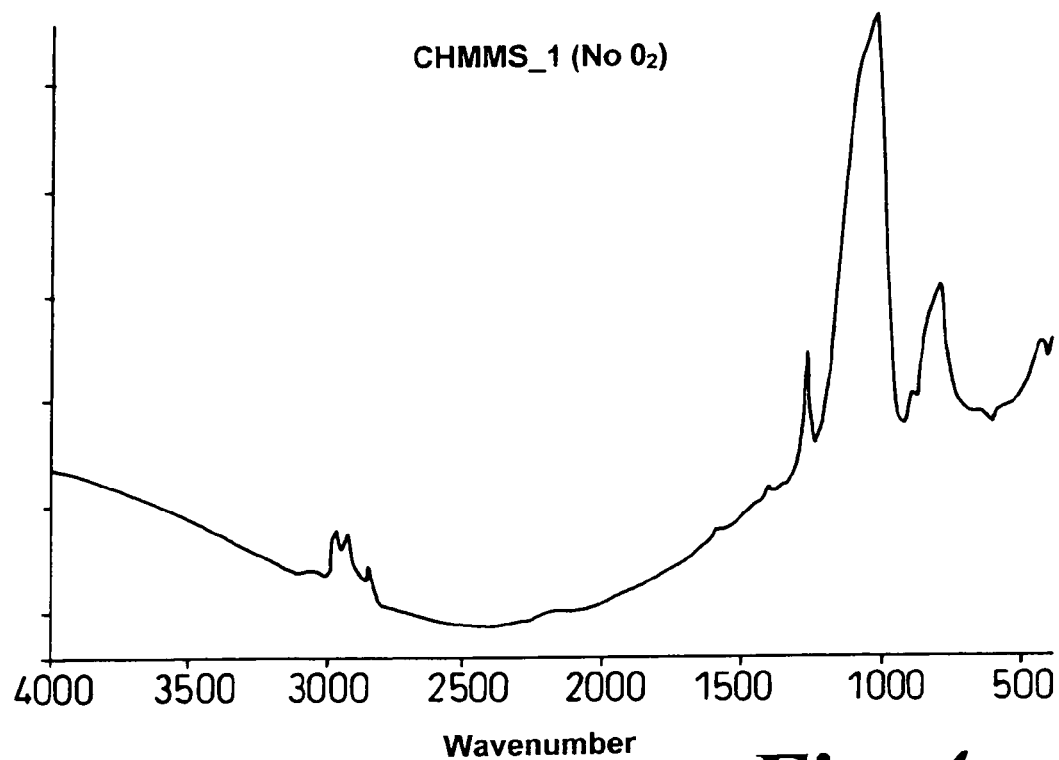
Figure 5:
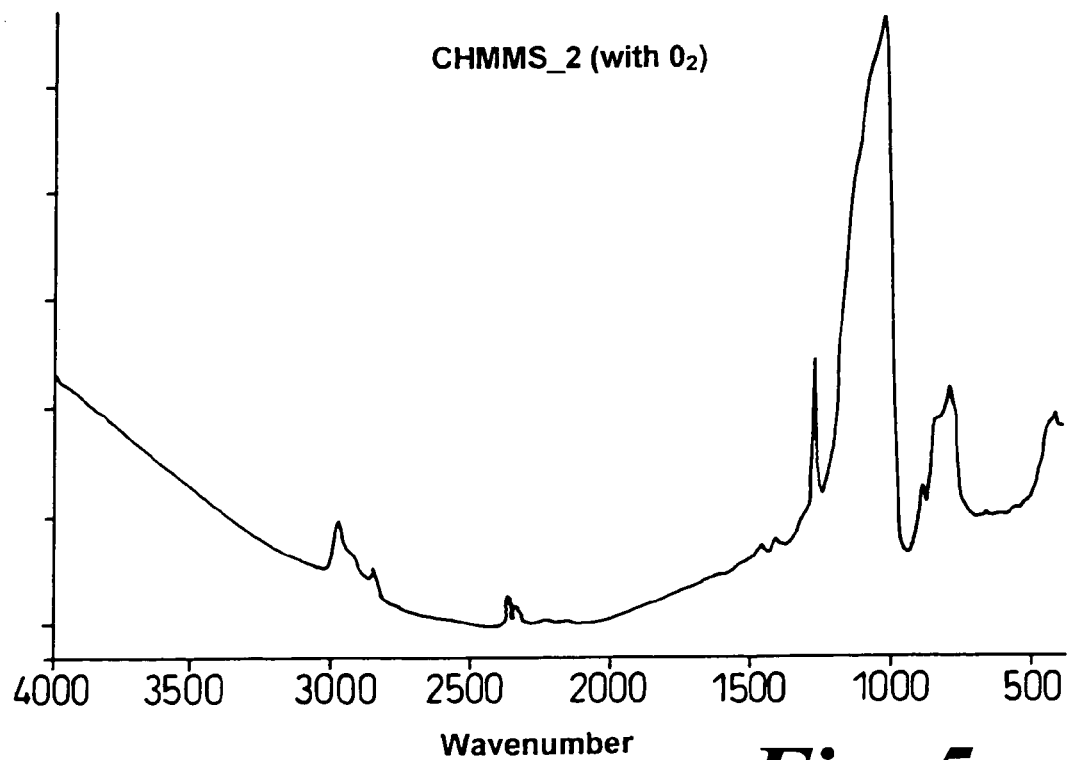
Figure 8:
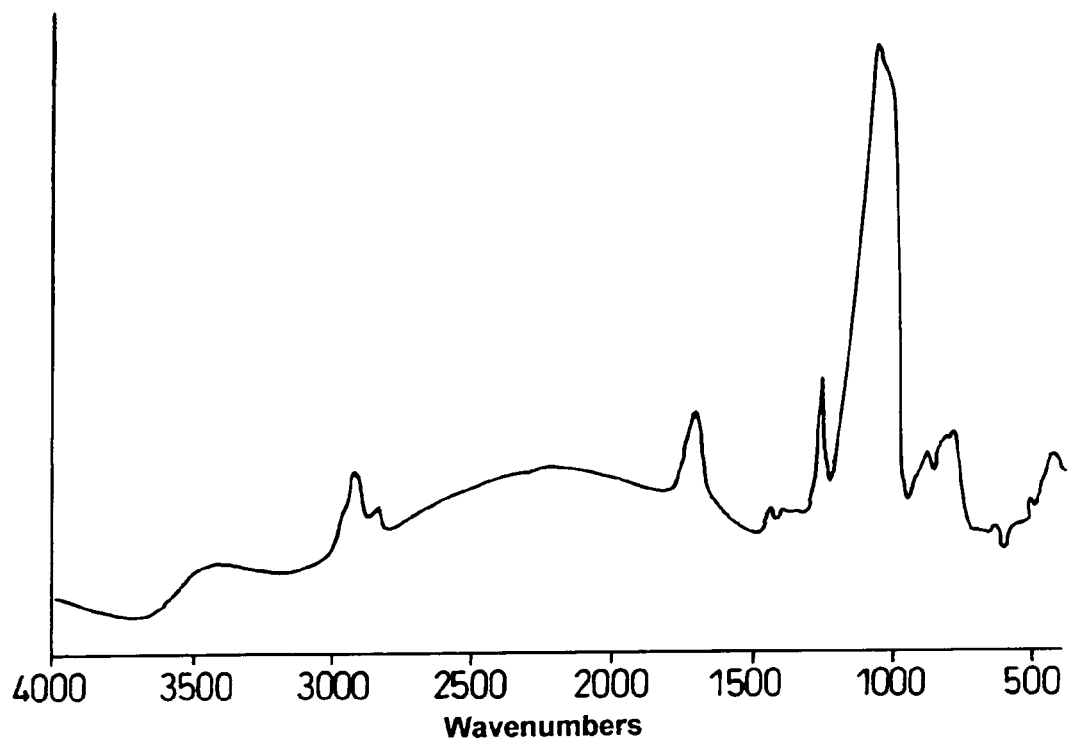
Figure 9:
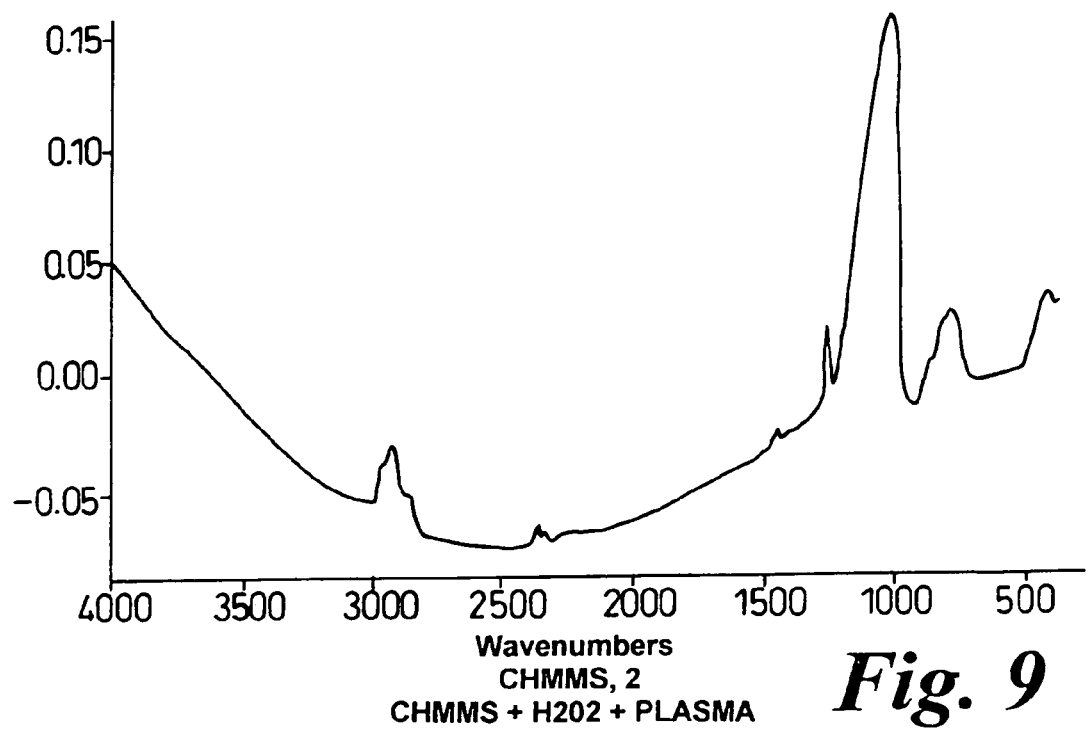
Figure 10:
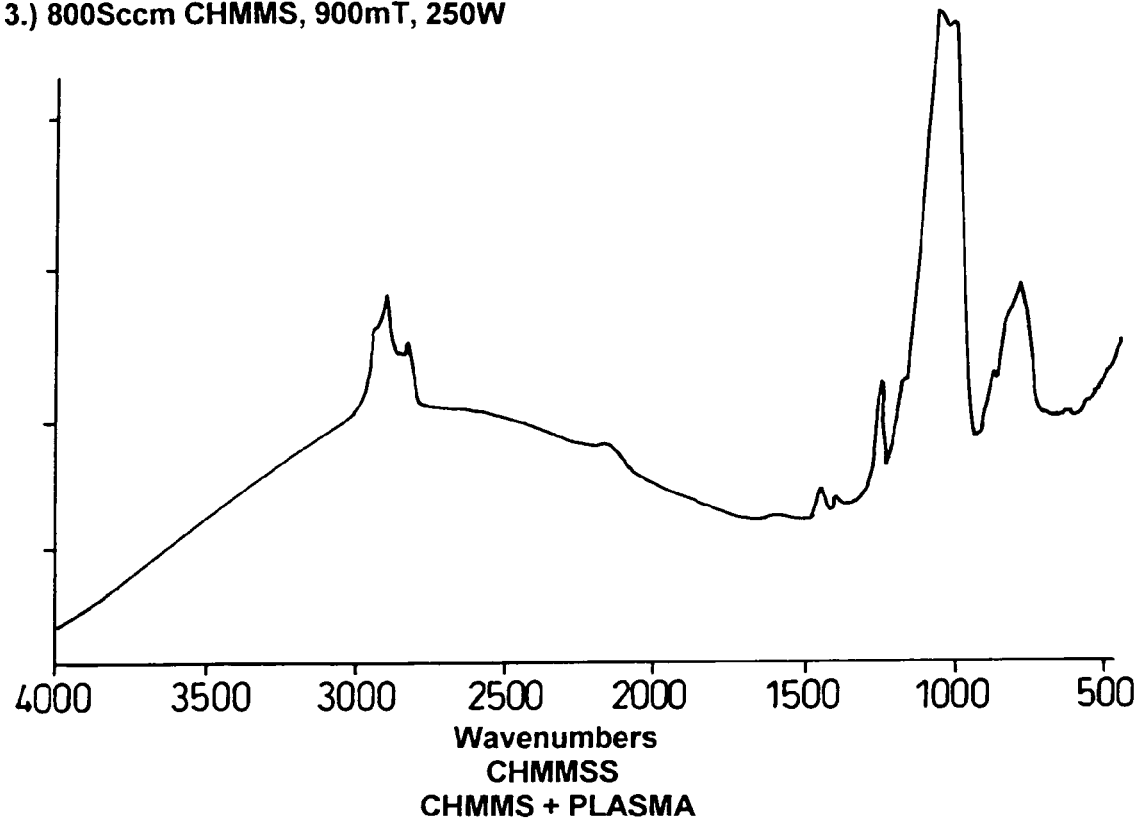
Figure 12:
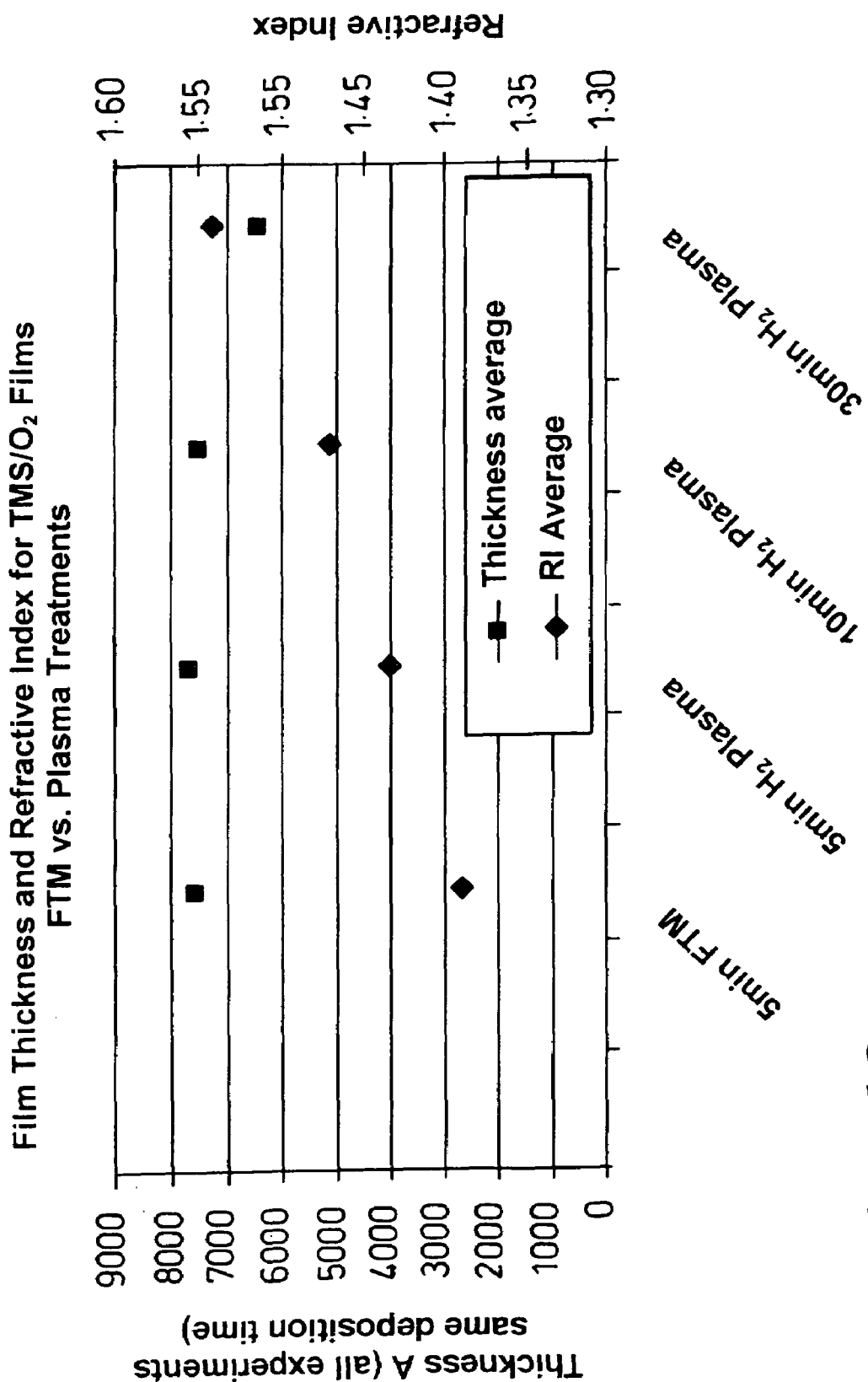
Figure 13:
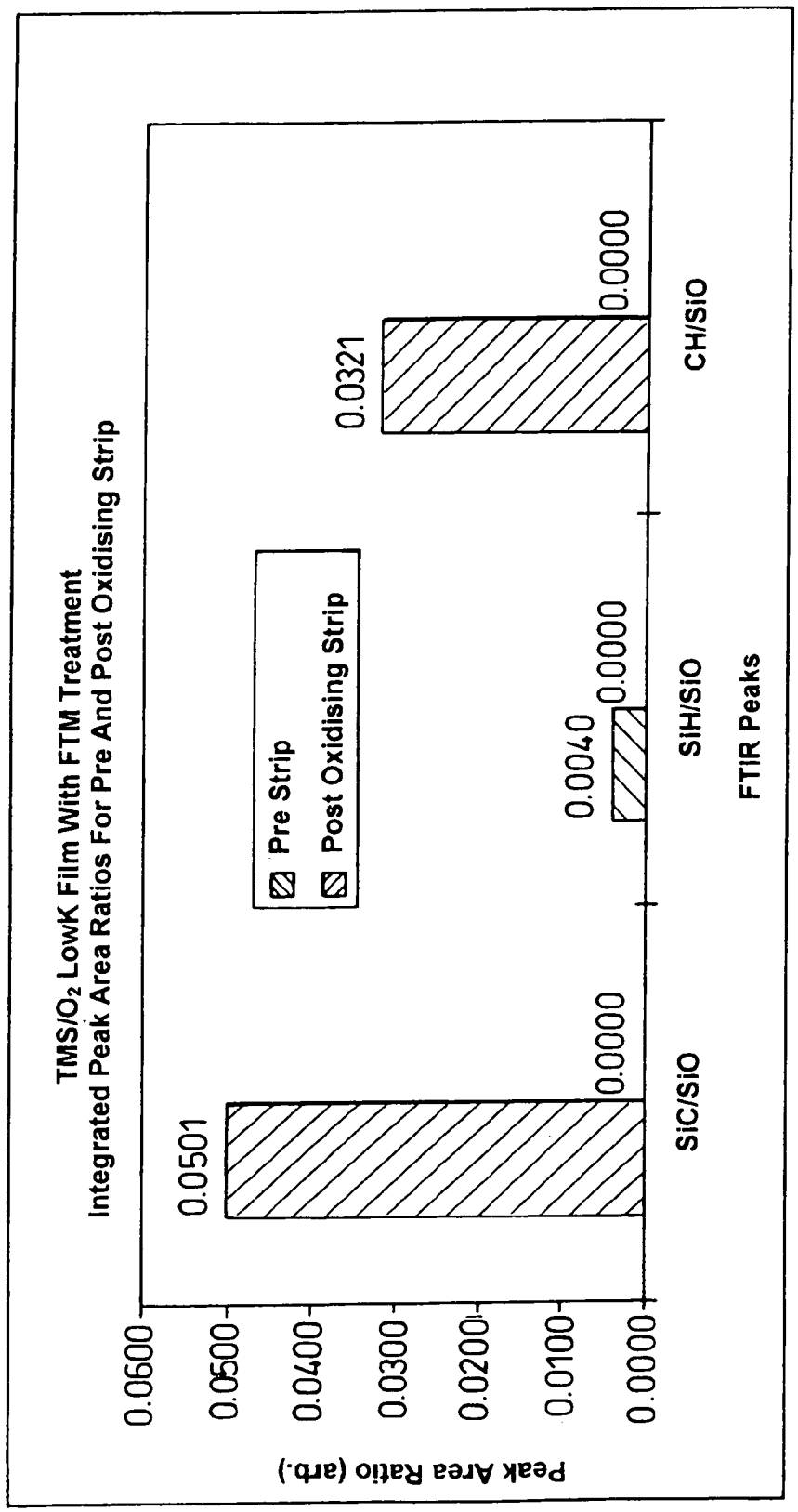
Figure 14:
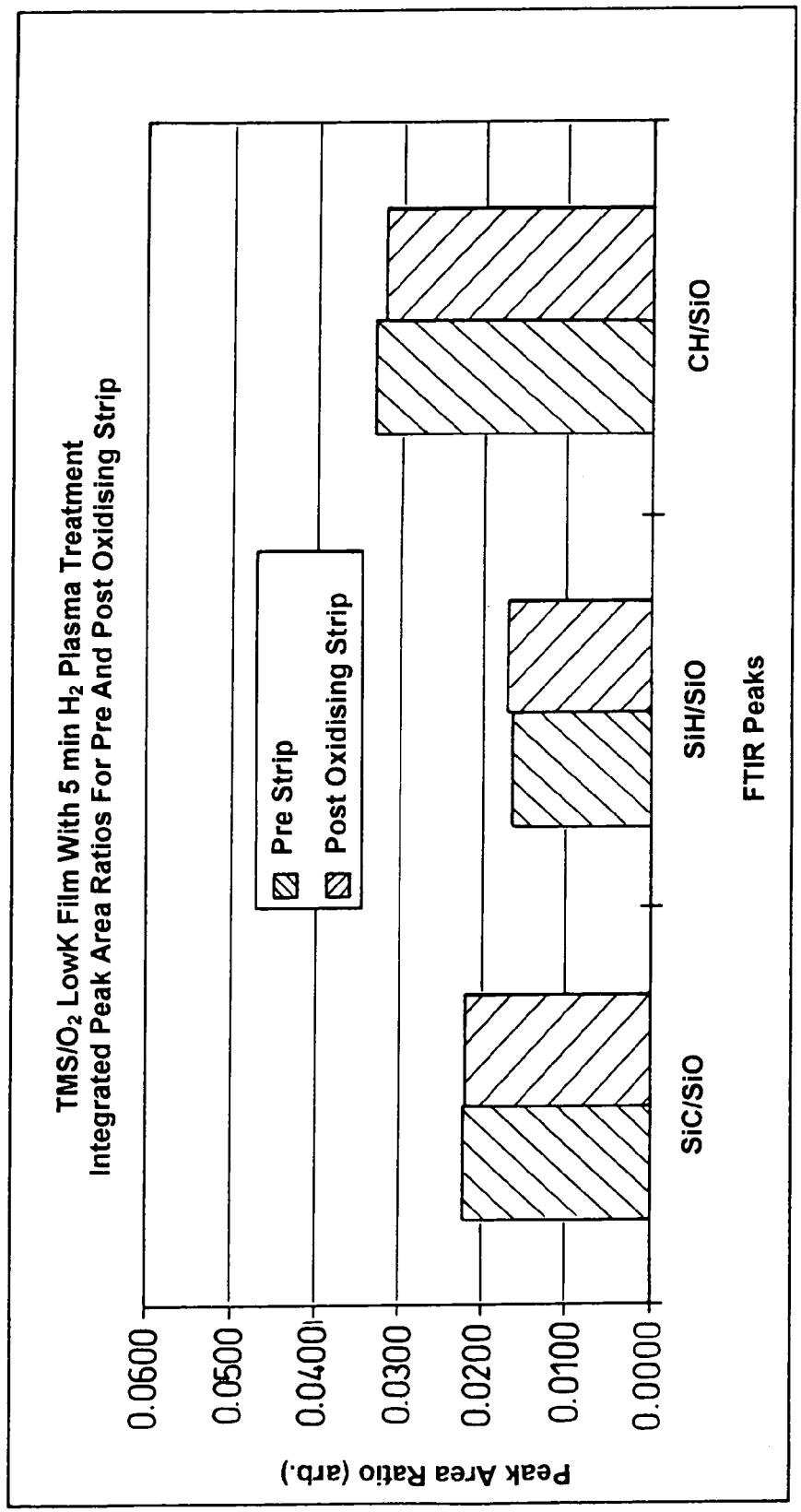
Figure 15:
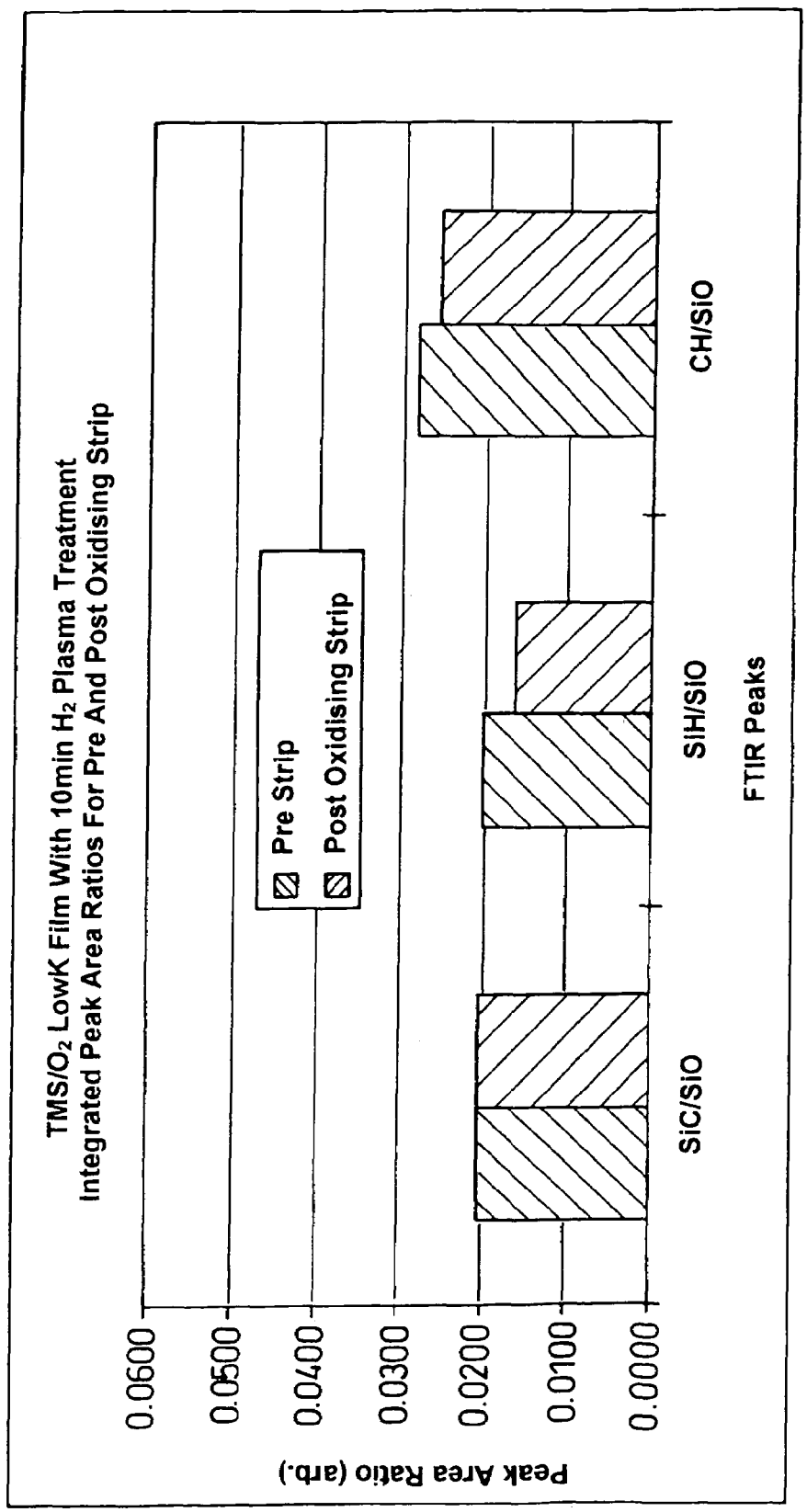
Figure 16:
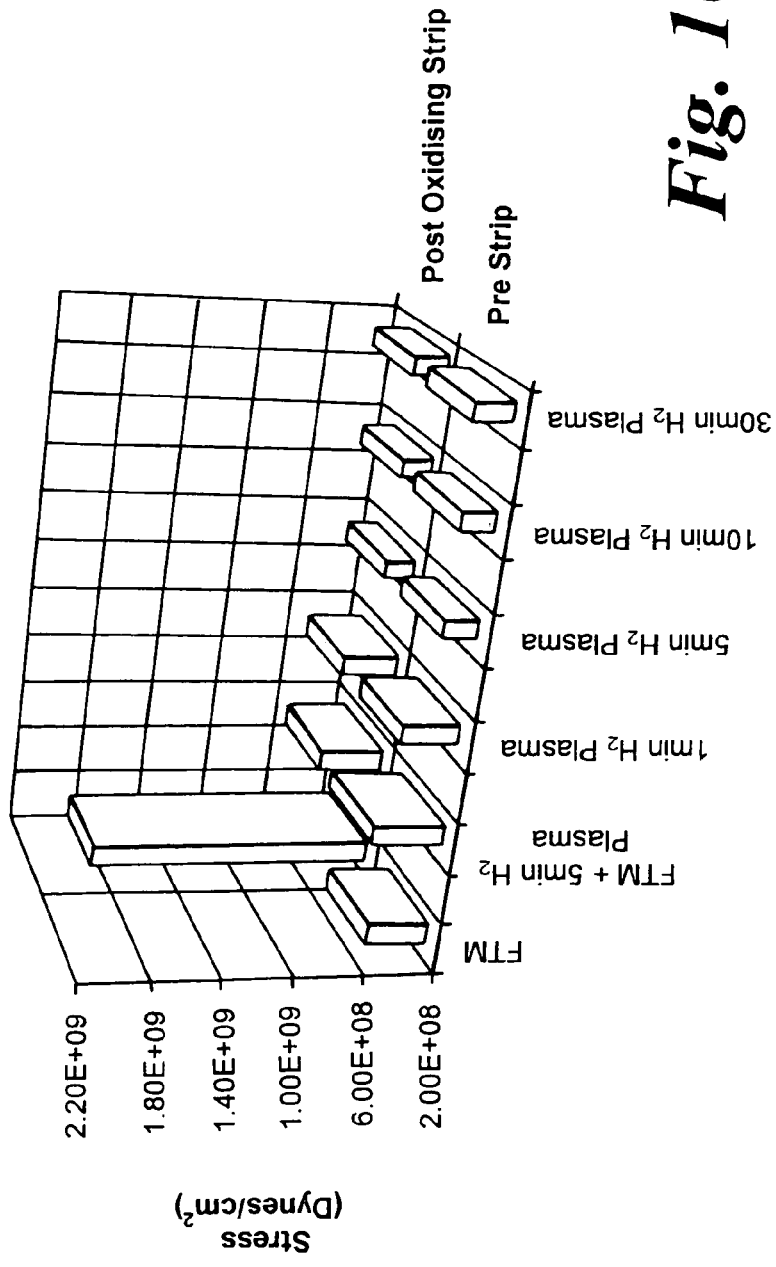
Figure 17:
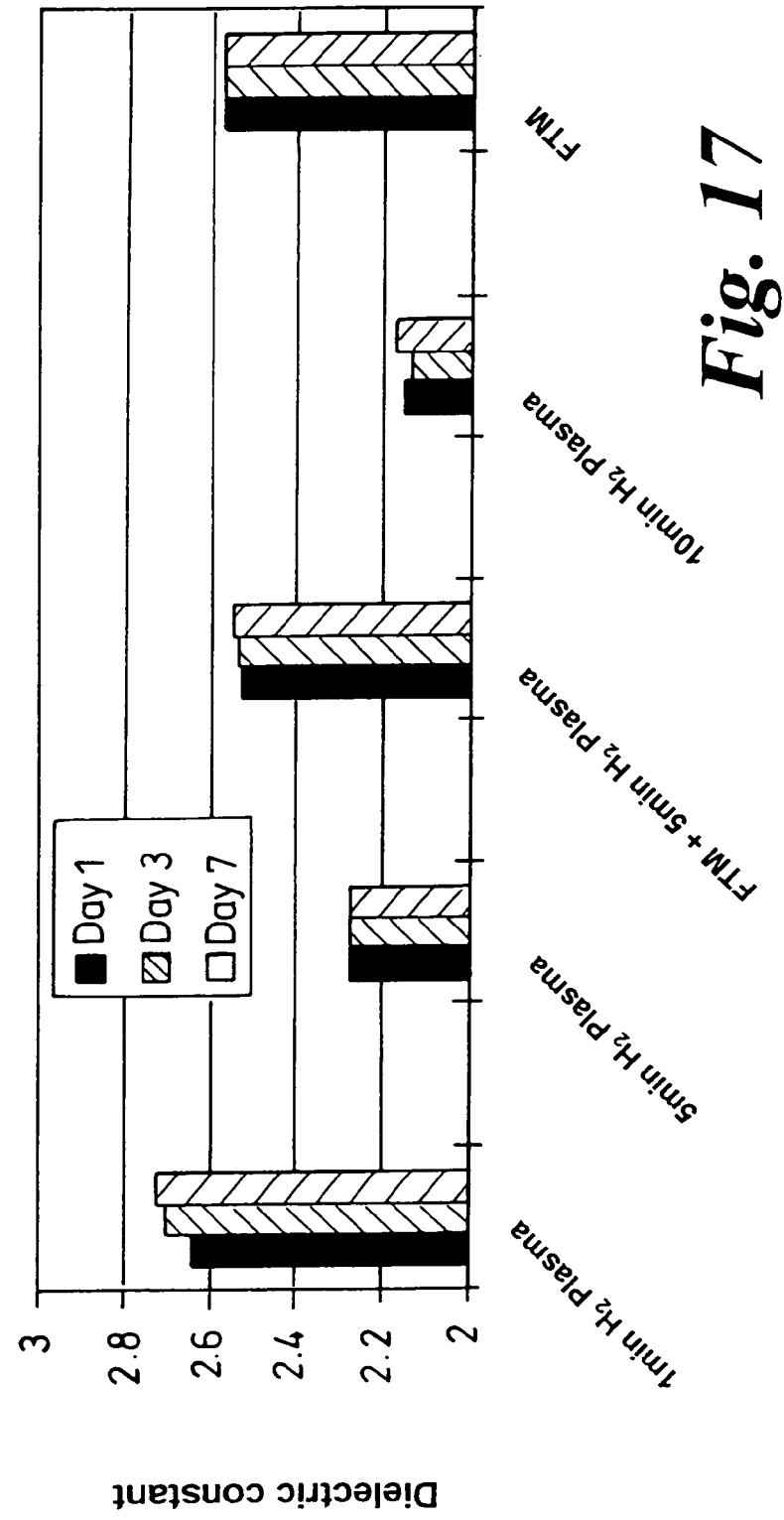
Figure 18:
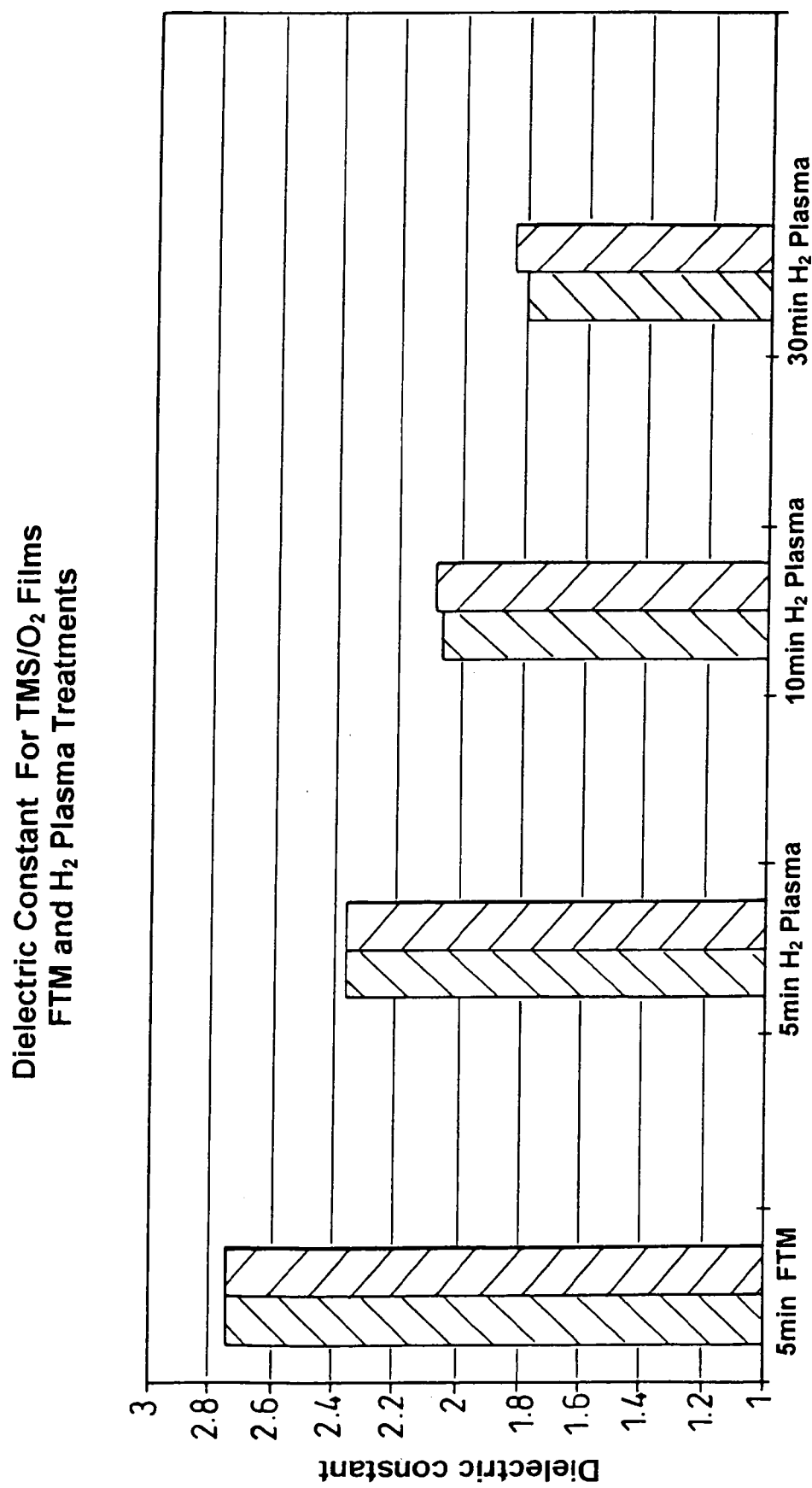
Figure 19:
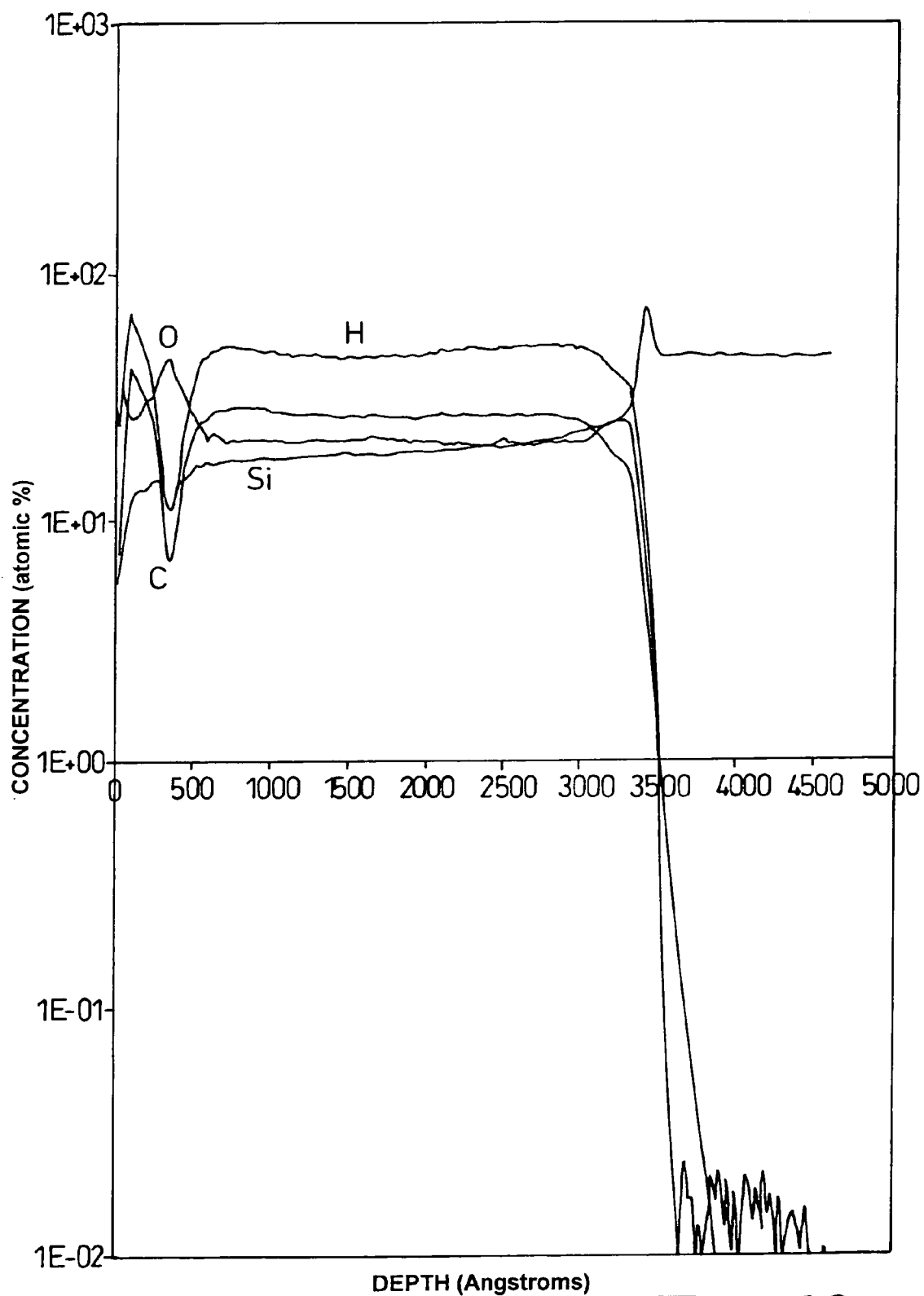

FIGS. 3(a) and 3(b) are scanning electron micrographs showing the annealed film formed by the present invention;

FIG. 4 is a Fourier Transform Infra-Red (FTIR) spectrum for a first process run without oxygen;

FIG. 5 is the equivalent FTIR for the process run with oxygen;

FIG. 6 is a table showing initial experimental results using standard delivery systems for CHDMMS;

FIG. 7 is a table showing experimental results using a syringe pump to deliver CHDMMS;

FIGS. 8 to 10 are FTIR spectrum relating to certain experiments identified in FIG. 7;

FIG. 11 shows FTIR plots for film formed from TMS after an anneal (FTM) process and after $H_2$ plasma processing when no anneal step has occurred;

FIG. 12 is a graph of plots showing the affect of an FTM process, a 5 min $H_2$ plasma and a 10 min $H_2$ plasma on the thickness and the refractive index of a TMS based film;

FIGS. 13 to 15 are respective bar graphs indicating the affects of an oxidising strip on FTM, 5 min $H_2$ plasma and 10 min $H_2$ plasma treated TMS+$O_2$ deposited films;

FIG. 16 illustrates the film stress values pre- and post-oxidising strip, after various post film formation treatment regimes;

FIG. 17 sets out the dielectric constant of TMS films after various post formation regimes;

FIG. 18 is a bar graph comparing the dielectric constant of layers treated by FTM, 5 min, 10 min and 30 min $H_2$ plasma for a pair of substrates; and FIG. 19 is a SIMS plot for a TMS+$O_2$ deposited film which has been set with a 5 min $H_2$ plasma.

Figure 1:
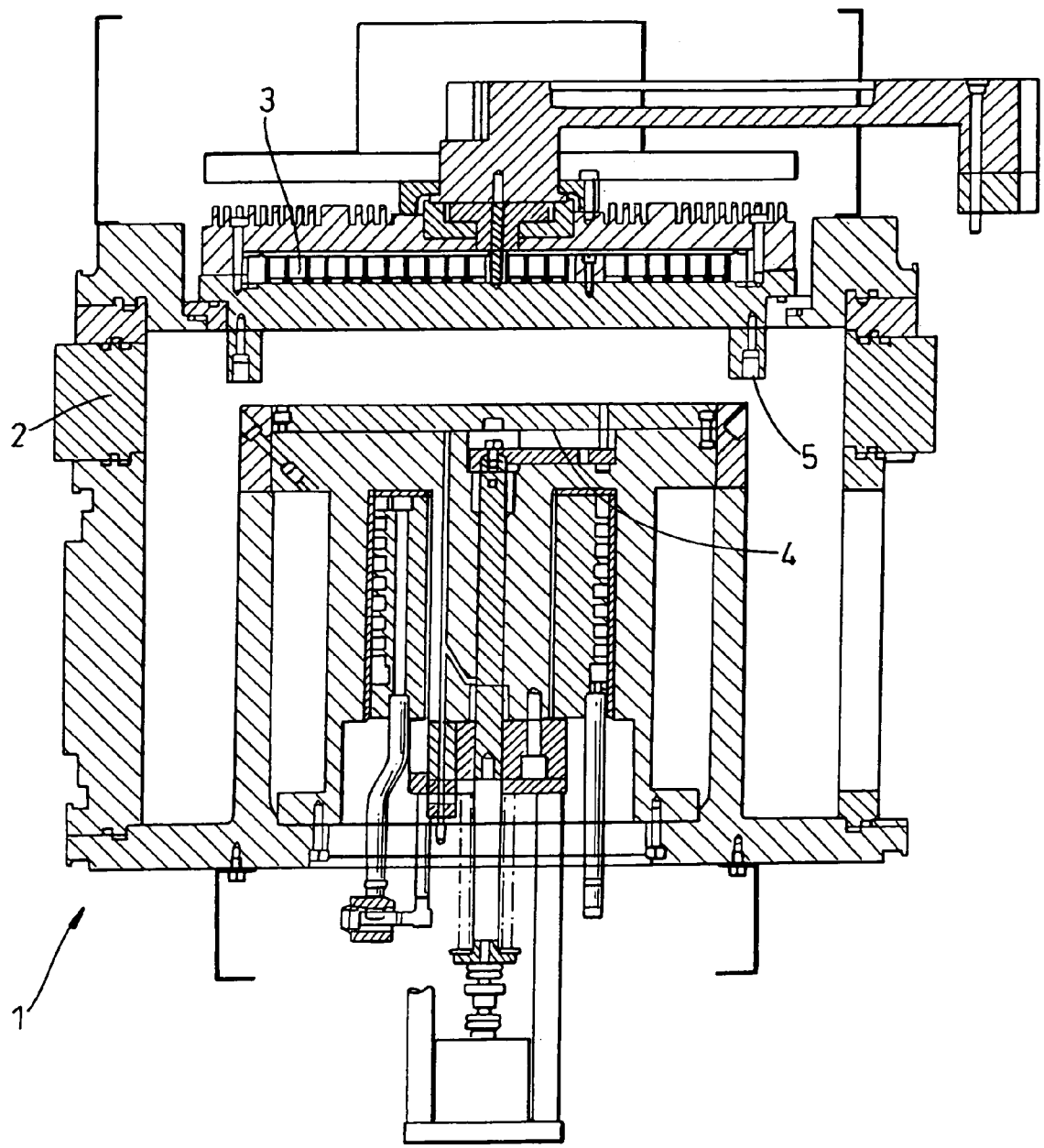
FIG. 1 is a schematic view of an apparatus for use in the present invention.

Referring to FIG. 1, there is shown an apparatus generally at 1 which includes a vacuum chamber 2 having a showerhead 3 and a wafer support or platen 4. The showerhead 3 is connected to an RF source (not shown) to form one electrode, whilst the support 4 if preferably earthed. Alternatively or additionally, the RF source could be connected to the support 4. The showerhead 3 is connected via pipes (not shown) to respective sources of tetramethylsilane and oxygen. The apparatus is generally of the form disclosed in EP-A-0731982, which is incorporated herein by reference. However, a standard (non-duplex) showerhead is normally used. Also shown is an optional uniformity ring 5 arranged around the showerhead 3. This ring 5 plays an active role in the uniformity of deposition of the film on the wafer and may be desirable for some processes.

In use, the apparatus 1 is arranged to deposit a water and/or OH containing intermediate layer on a wafer which may be flowable and may be used to produce a planar layer or for "gap filling" for applications such as pre-metal dielectric, shallow trench isolation and intermetal dielectric on semiconductor devices. The film is formed by introducing into the chamber tetramethylsilane and oxygen in gaseous or vapour form and reacting them within the chamber. This forms an intermediate layer with a degree of surface mobility even when a plasma is present. It has been found that very small dimensioned gaps can be filled by the process of the present invention. This is not to restrict the invention as often process conditions may yield an intermediate layer containing OH that does not flow but still retains the other characteristics of this invention. The reaction takes place in the presence of a plasma. Subsequently, the film is annealed by heating, preferably in the absence of oxygen and most preferably in the presence of a hydrogen containing plasma.

EXAMPLE

The precursor tetramethylsilane (TMS) has been applied with various other precursors, a platen temperature of approximately 0° C. and RF power of either low (e.g. 380 Khz) or high (e.g. 13.56 Mhz) frequency where indicated. The basic results were as follows:

| | |
|---|---|
| TMS + $H_2O_2$ | No deposition in the pressure range up to 5,000 mT |
| TMS + $MeSiH_3$ + $H_2O_2$ | Slight increase in carbon content over just $MeSiH_3$ + $H_2O_2$. Deposition rate ~6000 Å/min |
| TMS + $DiH_4$ + $H_2O_2$ | No carbon in the film. Deposition rate ~900 Å/min |
| TMS + $H_2O_2$ + RF | Deposition rate ~400 Å/min. High refractive index |
| TMS + $O_2$ + RF | Deposition rate over 2 micron/min - high carbon content. |

A 'preferred' process was then developed consisting of:

210 sccm TMS (calculated from fill rate checks)

200 sccm $O_2$ 2,000 mT pressure

0° platen temperature and 100° C. showerhead temperature 250 watts of 380 khz RF power applied to the showerhead.

This yielded a k value of 2.55 (measured by CV techniques) for a 6,000 Å thick film deposited without base or capping after an anneal at approximately 450° C. in the absence of oxygen.

Figure 2:
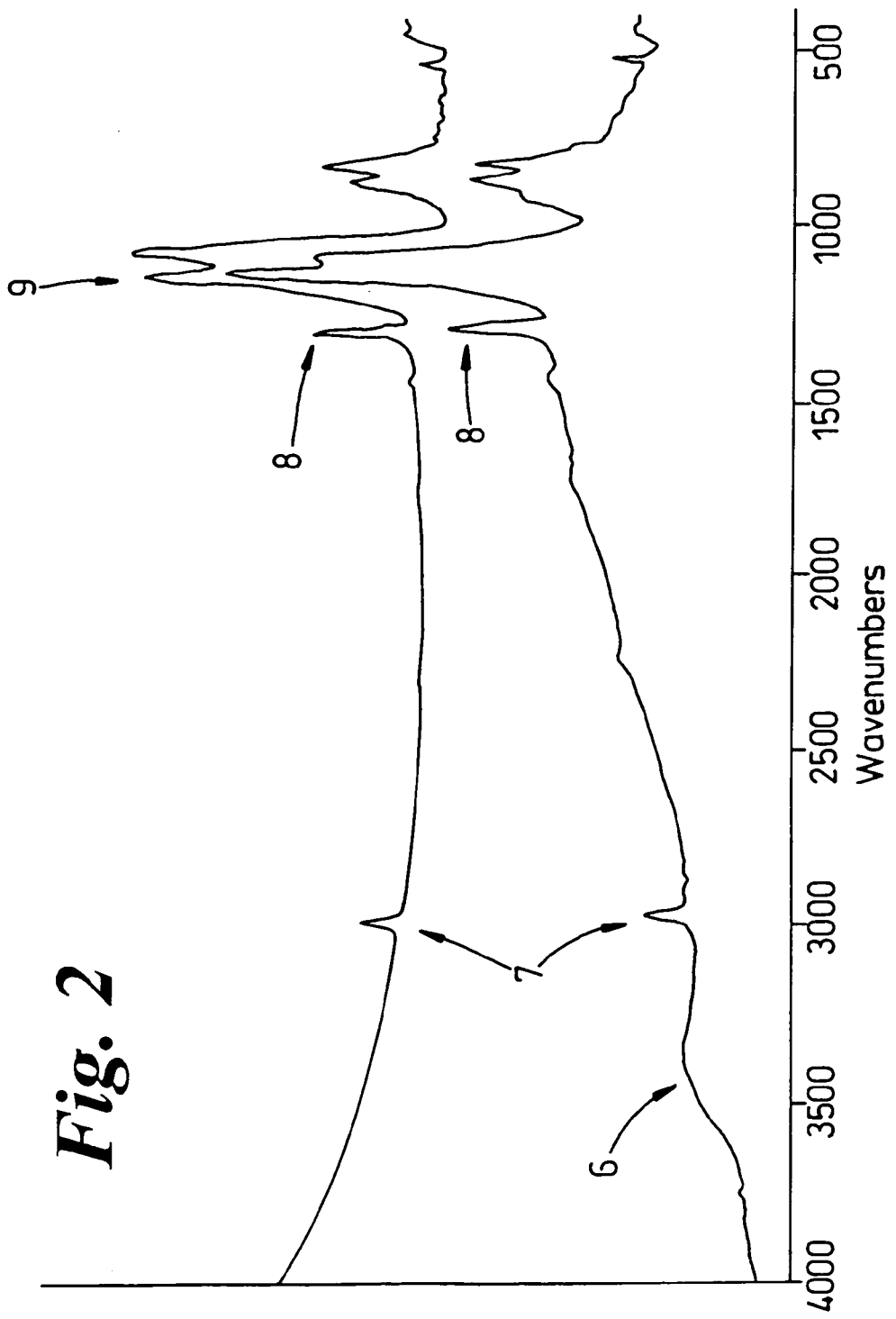
FIG. 2 is a Fourier Transform Infra-Red (FTIR) spectrum showing an as-deposited and annealed film according to this invention.

FIG. 2 shows a FTIR spectrum for an as-deposited and annealed film according to this aspect of the invention. The two spectra are shown overlain on the same diagram for ease of comparison. The as-deposited spectrum is the lower of the two and shows at 6 the characteristic peak of O—H bonds associated with water. Between 3,000 and 2,600 wave numbers O—H bonds associated with free water, isolated O—H and H bonded O—H are present. Water contains free water and H bonded O—H and thus gives a characteristically broad peak in this area. At 7 is the C—H$_3$ peak; at 8 is the Si—CH$_3$ peak (Si—C); and at 9 is the Si—O peak.

It can thus be seen that a film has been deposited containing water and/or OH which is subsequently removed by the annealing step and that CH$_3$ is present, is bonded to Si and remains in the film after annealing to form the hard film.

Generally, an indicator of low k characteristics is a high Peak Area Ratio (PAR) between Si—C and Si—O on the FTIR. It is believed Si—C bonds block Si—O bonds and thus reduce the density of the resultant film. Hence, a high Peak Area Ratio Si—C:Si—O is indicative of a low k film. It was however noted that for these plasma deposited and annealed films the measured k values were not as low as the Peak Area Ratio Si—C:SiO would suggest from non-plasma deposited low k films deposited from a reaction of methylsilane and peroxide.

Films of this invention as annealed as shown in FIG. 3 which demonstrate the flowing characteristics of the as-deposited film.

In general, the following effect of changing the parameters in a process have been observed:

| Parameter | Property Refractive Index | FTIR Peak Area Ratio SiC/SiO | CH/SiO | Uniformity |
|---|---|---|---|---|
| Pressure increase | down | up | up | better |
| Power increase | none | down | down | better |
| Nitrogen flow increase | up | down | down | worse |
| TMs/0$_2$ ratio increase | down | up | up | none |
| Total TMS/0$_2$ decrease | none | down | down | none |

An experiment has particularly been carried out using cyclohexyldimethoxymethylsilane (CHDMMS). As is reported below this has shown significantly reduced dielectric constants. It is anticipated that benefits will be found from many methoxysilane compounds such as tetramethoxysilane.

The experiments were carried out in a chamber substantially as shown in FIG. 1, or in our co-pending British Patent Application 9914879.3, with an electrode gap spacings of 40 mm and 20 mm and the uniformity ring shield used for non-plasma based processes removed. The CHDMMS was fed into the chamber using a syringe delivery system described in our co-pending British Patent Application No. 9922691.2, which is incorporated hereinby reference, as opposed to a traditional low vapour pressure mass flow controller. This was done due to the fact that, as described below, CHDMMS could not be reliably delivered by conventional means as it has a relatively high boiling point (approximately 200° C.) compared to most of the other precursor materials investigated in Application 9914879.3.

All processes were run with plasmas applied to the showerhead. All wafers were 'set' by annealing for typically 30 minutes at approximately 480° C.

The following parameter ranges have been investigated:

| | |
|---|---|
| Pressure | 500 mT to 1500 mT |
| Power (380 kHz) | 50 W to 750 W |
| Platen temperature | 0° C. to 70° C. |
| CHDMMS flows | 0.5 g/min to 1.5 g/min |
| Oxygen flows | 0 to 200 sccm |
| Nitrogen flows | 0 to 400 sccm |
| Peroxide flows | 0 to 0.75 g/min |

It will be appreciated that the relative flow rates are particularly relevant to the process. In general higher rates lead to higher deposition rates and thus a broad range of flow rates can achieve similar results. Thus values outside the above ranges may be applicable.

Two particularly preferred process examples are given below: one of these is with oxygen and one is without oxygen.

| | |
|---|---|
| Process 1 (no O$_2$) | |
| Pressure | 900 mT |
| Power | 500 W |
| Platen temperature | 50° C. |
| CHDMMS flow | 0.85 g/min |
| Nitrogen flow | 200 sccm |
| Process 2 (with O$_2$) | |
| Pressure | 900 mT |
| Power | 250 W |
| Platen temperature | 50° C. |
| CHDMMS flow | 0.85 g/min |
| Oxygen flow | 50 sccm |
| Nitrogen flow | 150 sccm |

The resultant films were annealed and the post anneal results were as follows:

| | |
|---|---|
| Process 1 (no O$_2$) | |
| Deposition rate | 17000 Å/min |
| Uniformity (max/min) | ±4% |
| Refractive index | 1.370 |
| Dielectric constant | 2.55 |
| Process 2 (with O$_2$) | |
| Deposition rate | 9500 Å/min |
| Uniformity (max/min) | ±5% |
| Refractive index | 1.340 |
| Dielectric constant | 2.25 |

As can be seen the dielectric constants in each case are desirably low, but the "with oxygen" process is significantly advantageous.

FIGS. 4 and 5 show the respective FTIR spectra post anneal. It will be seen that they are substantially similar. The feature between 2500 and 2000 in FIG. 5 is believed to result from atmospheric (background) CO$_2$.

In fact, initial experiments were carried out using a CHDMMS source consisting of a PTFE pot within an evacuated aluminium vessel which was heated to 150° C. The pot was connected by gas line to a gas mass flow controller suitable for H$_2$O with a conversion factor of 1.000. The RF power was applied to the showerhead with a spacing from the wafer of 40 mm. The RF was 380 khz continuous mode. Results from these experiments are shown in FIG. 6. The numbers in the CHDMMS column are the nominal gas flow as measured by the mass flow controller however stable flows could not be achieved and therefore these results are for near random quantities of CHDMMS being delivered to the process chamber. At this point experimentation was halted until a superior delivery system for this precursor could be developed.

CHDMMS has a boiling point of 201.2° C., and a density of 0.940 g/cc. As it was noted in these experiments that CHDMMS deposits a low k insulator without the addition of an oxidising agent it is therefore possible that it could be delivered as a liquid to a semiconductor wafer without a chamber being required (e.g. by well known 'spin-on' techniques) and then reacted either thermally or by plasma to form a low k (k<3) insulator layer. The apparatus used may in effect deposit a liquid by vaporising the liquid precursor, delivering it as a vapour and then condensing it onto the wafer at a temperature below the boiling point of the precursor at that pressure. It is not yet clear if the reactions to the precursor take place on the wafer or at some other place, depositing reaction products onto the wafer.

Having developed a more suitable liquid delivery system which utilises a syringe pump, further experiments were carried out as shown in FIG. 7. From these experiments preferred processes were developed as further described here. FTIR for runs 13, 14 and 16-23 of FIG. 6 respectively are illustrated in FIGS. 8 to 10.

Further experiments have been carried out using the following conditions:

| | |
|---|---|
| Pressure: | 2500 millitorr |
| RF Power at 13.56 Mhz | 250 watts/200 mm wafer |
| Showerhead temperature | 100° C. |
| TMS flow | 100 sccm (approximately) |
| Oxygen flow | 100 sccm |
| Nitrogen flow | 500-600 sccm |

The ratio of TMS (tetramethylsilane) to oxygen is the same as previously (approximately equal quantities), but at half the total flow rates. In this preferred process nitrogen has been used, primarily as a dilutant.

Thermal treatment step ("setting" or "anneal")

| | |
|---|---|
| Time | 5 minutes |
| Pressure | 10 torr nitrogen (no oxygen) |
| Wafer temperature | 400° C. approximately |

In the process above, where the process platen temperature was varied, the results were as follows Once more the initial deposition process puts down a water and/or OH containing intermediate film which needs to be set to substantially remove the water and/or OH to create a low k layer. For the purposes of the above experiment this setting was achieved by a thermal treatment step as indicated. However other post deposition processes have been experimented with, as can be seen below. The significant features of this experiment were both the continued achievement of a dielectric constant below 3 and the observation that both the refractive index (which is believed to be a measurement of density) and the dielectric constant dipped when a platen temperature of 30° was used. These results are consistent with the normal understanding that dielectric constant and density are related for a specific film composition, so that lower refractive index will normally indicate a lower dielectric constant.

Subsequent to this experiment a further set of films were formed using the following process matrix:

| | |
|---|---|
| TMS | 100 sccm |
| O2 | 100 sccm |
| N2 | 600 sccm |
| Pressure | 2000 mT |
| Substrate support | 30° C., DC ground potential (unbiased) |
| Power | 250 Watts High Frequency 13.56 MHz to the showerhead |

The films resulting from this process were set either by the annealing process (which is hereinafter referred to as FTM treatment) or process and/or by treating the film with an $H_2$ plasma treatment.

| The FTM process was as follows: | |
|---|---|
| Wafer temperature | 450° C. |
| Pressure | 10 Torr (Nitrogen) |
| Time | 35 minutes |
| The $H_2$ plasma treatment was as follows: | |
| Hydrogen | 1000 sccm |
| Pressure | 4000 MT |
| Temperature | 400° C. |
| Power | 2000 Watts High Frequency 13.56 MHz to an electrode opposed the wafer |
| Time | Depends on thickness but typically 3 minutes for 6 kÅ although longer times appear to lead to lower K. |

Alternatively other RF frequencies could be used applied to any electrode or electrodes either internal or external to the wafer containing chamber such as to create or sustain

| T Rate | | Non-Uniformity | FTIR | | | RI | Dielectric |
|---|---|---|---|---|---|---|---|
| ° C. | Å/min | % max/min | SiC/SiO | SiH/SiO | CH/SiO | av. | constant |
| 10 | 7,778 | 2.7 | 0.0608 | 0.0060 | 0.0287 | 1.3825 | 2.72 |
| 20 | 7,673 | 3.8 | 0.0594 | 0.0057 | 0.0280 | 1.3832 | 2.72 |
| 30 | 7,589 | 4.8 | 0.0588 | 0.0059 | 0.0282 | 1.3791 | 2.65 |
| 45 | 7,543 | 3.1 | 0.0584 | 0.0056 | 0.0273 | 1.3867 | 2.70 |
| 55 | not recorded | | 0.0527 | 0.0044 | 0.0234 | not recorded | 2.75 |
| 60 | 6,968 | 3.9 | 0.0512 | 0.0074 | 0.0293 | 1.3935 | 2.69 | ionised hydrogen species adjacent to the film to be treated. This is to include remote plasma sources including microwave and inductively completed RF sources wherever situated.

The $H_2$ plasma may also contain other components e.g. effectively inert dilutants for example argon, helium or other gasses or vapours that do not detract from this treatment.

FIG. 11 shows respective FTIR plots for the film prepared as described above and then treated by FTM or by plasma. Beneath each chart is an indication of the bonding ratios between various components. As will be understood by a man skilled in the art the slope of the graph is not relevant in a FTIR plot; it is only the peaks which provide information. The relative heights of the peaks are indicated by the ratio tables and it will be seen that there is a significant reduction in the bonding between the various components in a plasma treated film as compared with one that has had the FTM post deposition treatment. This indicates that the hydrogen plasma treated intermediate film is structurally different from the FTM treated intermediate film.

In FIG. 12 the upper plot indicates that there is no significant difference in film thickness between the various post treatment processes, but there is a significant driving up of the refractive index the longer a plasma treatment takes place. Indeed after a 10 minute $H_2$ plasma, the refractive index is approaching that of pure SiO. Normally, as has been explained above, this would be expected to result in a significant increase in dielectric constant, but as can be seen in FIG. 17 an increase in the period of the $H_2$ plasma treatment simultaneously produces a significant decrease in the dielectric constant, provided that the film is not subject to heat treatment prior to the plasma treatment. Thus after a 10 minute $H_2$ plasma treatment the OH containing film is set and has a dielectric constant of below 2.2, which is an extremely low figure typically unachievable by chemical vapour deposition means.

It will be noted that a very short $H_2$ plasma treatment (e.g. 1 minute) does not render the film totally stable nor does it reduce significantly the dielectric constant below an FTM anneal although the film is still comparable with other reported films. Wet etch rate experiments have demonstrated that the hydrogen plasma treatment starts at the top of the film. The longer the plasma process, the greater the depth treated the lower the k value of the treated film. The hydrogen plasma treated film etches considerably (e.g. 20 or more times) slower than the FTM treated film. It will also be observed that an $H_2$ plasma treatment is also not effective in reducing dielectric constant after a previous heating or anneal step.

Turning now to FIGS. 13, 14 and 15 it will be seen in FIG. 13 that film which has had the FMT treatment appears to be very susceptible to an oxidising process e.g. a photoresist strip with carbon and hydrogen seemingly being removed from the material. This is not totally surprising, because such an oxidising process was previously used to remove such materials in the film (in particular organics from precursors) before it was appreciated that they might have a beneficial affect on the dielectric constant. FIGS. 14 and 15, on the other hand, show that the plasma treated films are substantially unaffected by the oxidising photoresist strip process. This is of course important, because it makes it much easier to remove resist from the surface of the dielectric layer without damaging that layer. FIG. 16 shows that the plasma treated films also have particularly low stress values whether before or after the oxidising strip.

It is believed that similar results would be achieved with most flowable or water and/or OH containing films that retain carbon, more particularly CH, in the finally used dielectric layers.

Thus the inventors have, in particular determined a process for depositing a flowable or at least OH containing intermediate film which is subsequently set using heat in the absence of oxygen and preferably in the presence of an $H_2$ containing plasma with the result that the film has a dielectric constant below 3 and, with the application of hydrogen plasma, a reduced dielectric constant and a good resistance to oxidising strip. It is postulated that this combination results from the surprising fact that $H_2$ treatment reduces the dielectric constant whilst increasing the refractive index and hence, almost certainly the density as evidenced by a greatly reduced wet etch rate.

Further evidence for this is illustrated in FIGS. 18 and 19. FIG. 18 shows that progressive treatment by $H_2$ plasma drives down the dielectric constant, with samples treated for 30 minutes achieving a k of 1.8.

FIG. 19 provides analysis of the hydrogen plasma treated film has been carried out as follows:

SIMS (secondary ion mass spectrometry) data of a TMS+ $O_2$ deposited film that has been hydrogen plasma treated for 5 minutes has been generated. [The horizontal axis is through the depth of the sample starting at just above the surface and ending in the silicon wafer. What is shown is an organic contaminated (high C) sample surface (to be ignored), followed by a 'true' analysis].

The SIMS profile shows a film surface depleted of carbon and hydrogen by the hydrogen plasma treatment. This is a not unsurprising result and is consistent with a measurable difference in the dielectric constant of this surface layer and the bulk of the film. When this surface is etched away the remainder of the film (adjusted for it's reduced thickness) has a lower dielectric constant than the whole of the film including this surface layer. Yet the whole film including this carbon depleted surface has a lower k value than an FTM treated film.

Wet etch rate experiments show that the hydrogen plasma treatment commences at the upper surface and progresses through the film. The hydrogen plasma treated film wet etches considerably more slowly than an FTM treated film and thus provides clear evidence that depth of treatment increases with plasma treatment times.

It is postulated that the hydrogen plasma treatment effectively replaces Si—$CH_3$ in the film with Si—$CH_2$—Si (by intermediate reactions in which hydrogen ions and radicals play a part) with increased Si—Si linkage responsible for the increase in the refractive index.

The invention claimed is:

1. A method of forming a film having a dielectric constant of 2.55 or less on a substrate, said method comprising:
   (a) positioning the substrate on a D.C. grounded support in a chamber;
   (b) supplying to the chamber in gaseous or vapour form a silicon-containing organic compound and an oxidizing agent in the presence of a plasma to deposit a film on the substrate positioned on the grounded support, wherein the plasma is supplied from an RF power source connected to an electrode opposing the grounded support; and
   (c) setting the film such that carbon-containing groups and Si—H bonds are contained therein and the film has a dielectric constant of 2.55 or less, wherein the oxidising agent is oxygen.

2. A method according to claim 1, wherein the silicon-containing organic compound is an alkylsilane.

3. A method according to claim 1, wherein the silicon containing organic compound is a tetraalkylsilane.

4. A method according to claim 1, wherein the silicon-containing organic compound is a methylsilane.

5. A method according to claim 2, wherein the silicon-containing organic compound is cyclohexyldimethoxymethylsilane.

6. A method according to claim 1, wherein the grounded supported is at a low temperature during deposition of the film.

7. A method according to claim 1, wherein the grounded support is at a temperature between about 0° C. to about 60° C. during deposition of the film.

8. A method according to claim 4 wherein the grounded support is at about 30° C. during deposition of the film.

9. A method of forming a film having a dielectric constant of 2.55 or less on a substrate, said method comprising:
 (a) positioning the substrate on a D.C. grounded support in a chamber;
 (b) supplying to the chamber in gaseous or vapour form tetramethylsilane and oxygen in the presence of a plasma to deposit a film on the substrate positioned on the grounded support in the chamber, wherein the plasma is supplied from an RF power source connected to an electrode opposing the grounded support; and
 (c) setting the film such that carbon-containing groups and Si—H bonds are contained therein and the film has a dielectric constant of 2.55 or less.

10. A method as claims in claim 9 wherein the film is set by exposing it to an $H_2$ containing plasma without any prior annealing or heating step.

11. A method as claimed in claim 10 wherein the $H_2$ containing plasma is substantially only a $H_2$ plasma.

12. A method as claimed in claim 10 wherein the $H_2$ containing plasma treatment last for between 30 seconds and 30 minutes.

13. A method as claimed in claim 10 wherein the $H_2$ containing plasma treatment lasts from 1 to 10 minutes.

14. A method as claimed in claim 10 wherein the $H_2$ containing plasma treatment step lasts no more than 5 minutes.

15. A method as claimed in claim 10 wherein the $H_2$ containing plasma treatment step lasts no more than 10 minutes.

16. A method as claimed in claim 10 where the hydrogen containing plasma is applied simultaneously with heating.

17. A method as claimed in claim 16 where the substrate is heated to approximately 400° C.

18. A method as claimed in claim 1 where the setting of the film substantially removes water and/or OH peaks from the FTIR spectra of the as deposited film.

19. A method as claimed in claim 1, wherein said setting includes annealing the film to remove at least one of $H_2O$ and OH from the film with the carbon-containing groups remaining therein.

20. A method as claimed in claim 1, wherein said setting includes subjecting the film to a hydrogen-containing plasma to remove at least one of $H_2O$ and OH from the film with the carbon-containing groups remaining therein.

21. A method as claimed in claim 9, wherein said setting includes annealing the film to remove at least one of $H_2O$ and OH from the film with the carbon-containing groups remaining therein.

22. A method as claimed in claim 9, wherein said setting includes subjecting the film to a hydrogen-containing plasma to remove at least one of $H_2O$ and OH from the film with the carbon-containing groups remaining therein.

23. A method as claimed in claim 9, wherein said setting includes annealing the film to remove at least one of $H_2O$ and OH from the film with the carbon-containing groups remaining therein.

24. A method as claimed in claim 9, wherein said setting includes subjecting the film to a hydrogen-containing plasma to remove at least one of $H_2O$ and OH from the film with the carbon-containing groups remaining therein.

25. A method according to claim 1, further comprising depositing a resist on the set film and subsequently stripping the resist using oxygen.

26. A method according to claim 25, wherein the film is substantially unaffected by the oxygen used in stripping the resist.

27. A method according to claim 9, further comprising depositing a resist on the set film and subsequently stripping the resist using oxygen.

28. A method according to claim 27, wherein the film is substantially unaffected by the oxygen used in stripping the resist.

* * * * *